US006617757B2

(12) United States Patent
Vazquez Carazo et al.

(10) Patent No.: US 6,617,757 B2
(45) Date of Patent: Sep. 9, 2003

(54) ELECTRO-LUMINESCENT BACKLIGHTING CIRCUIT WITH MULTILAYER PIEZOELECTRIC TRANSFORMER

(75) Inventors: Alfredo Vazquez Carazo, Norfolk, VA (US); Gregory Paul Thomas, Virginia Beach, VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/998,245

(22) Filed: Nov. 30, 2001

(65) Prior Publication Data

US 2003/0102774 A1 Jun. 5, 2003

(51) Int. Cl.[7] ............................................... H01L 41/08
(52) U.S. Cl. ........................ 310/317; 310/318; 310/359; 310/366; 310/357
(58) Field of Search ................................ 310/318, 317, 310/359, 366, 357

(56) References Cited

U.S. PATENT DOCUMENTS

| | | | | | |
|---|---|---|---|---|---|
| 5,814,922 | A | * | 9/1998 | Uchino et al. | ............... 310/359 |
| 6,114,797 | A | * | 9/2000 | Bishop et al. | ............... 310/318 |
| 6,278,625 | B1 | * | 8/2001 | Boyd | ............... 363/132 |
| 6,326,718 | B1 | * | 12/2001 | Boyd | ............... 310/359 |
| 6,346,764 | B1 | * | 2/2002 | Boyd | ............... 310/366 |
| 6,366,006 | B1 | * | 4/2002 | Boyd | ............... 310/359 |
| 6,433,458 | B2 | * | 8/2002 | Nakatsuka et al. | .... 310/316.01 |

FOREIGN PATENT DOCUMENTS

| | | | | | |
|---|---|---|---|---|---|
| JP | 11317553 | A | * | 11/1999 | ......... H01L/41/107 |
| JP | 11330575 | A | * | 11/1999 | ........... H01L/41/08 |
| JP | 11330580 | A | * | 11/1999 | ......... H01L/41/107 |
| JP | 2000082853 | A | * | 3/2000 | ......... H01L/41/107 |
| JP | 2000236123 | A | * | 8/2000 | ......... H01L/41/107 |
| JP | 2000294847 | A | * | 10/2000 | ......... H01L/41/107 |
| JP | 2001068752 | A | * | 3/2001 | ......... H01L/41/107 |

OTHER PUBLICATIONS

Kim et al., High Power Electronic Ballast for Fluorescent Lamp, Oct. 3, 2002, U.S. patent application Publication, US 2002/0140375 A1.*

Nakatsuka et al., Method and Unit for Driving Piezoelectric Transformer Used for Controlling Luminance of Cold Cathode Tube, Nov. 1, 2001, U.S. patent application Publication, US 2001/0035698 A1.*

Nakatsuka et al., Drive Device and Drive Method for a Cold Cathode Fluorescent Lamp, U.S. patent application Publication, US 2002/0121865A1.*

\* cited by examiner

*Primary Examiner*—Thomas M. Dougherty
*Assistant Examiner*—J. Aguirrechea
(74) *Attorney, Agent, or Firm*—David J. Bolduc

(57) ABSTRACT

The present invention relates to a multilayer piezoelectric transformer that uses a composite resonant vibration mode for step-up voltage conversion. More specifically, a multilayer piezoelectric transformer is provided using radial and shear vibration modes for step-up voltage conversion applications. Adjacent layers of piezoelectric ceramic act as a constraint on the deformation of one face of the input layers, leading to a gradient in the radial deformation of both the input and output portions. The piezoelectric transformer is used in a circuit for providing electro-luminescent (EL) backlighting.

17 Claims, 8 Drawing Sheets

ELECTRO-LUMINESCENT BACKLIGHTING CIRCUIT WITH MULTILAYER PIEZOELECTRIC TRANSFORMER

BACKGROUND OF INVENTION

1. Field of Invention

The present invention relates generally to a voltage converter having multiple layers of piezoelectric ceramic. More specifically, the present invention relates to a multilayer piezoelectric transformer that uses a composite resonant vibration mode for step-up voltage conversion. The piezoelectric transformer may be used in a circuit for providing electro-luminescent (EL) backlighting.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and the dimensions of the materials involved in the construction of the transformer, including the piezoelectric ceramic layers and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. Patent No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of. the slab is polarized longitudinally, and has a high impedance in the direction of polarization. The remainder of the slab, the vibrator portion 21 is polarized transversely to the plane of the slab's face (in the thickness direction) and has a low impedance in the direction of this polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode (d31 mode). The transverse effect mode vibration in the low impedance vibrator portion 21 in turn excites a vibration in the high impedance generator portion 22 in a longitudinal effect longitudinal vibration mode (g33 mode). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

An inherent problem of such prior PTs is that they have relatively low power transmission capacity. This disadvantage of prior PTs relates to the fact that little or no mechanical advantage is realized between the vibrator portion 21 of the device and the driver portion 22 of the device. Because the driver and vibrator portions each is intrinsically a part of the same electroactive member, the transmission of energy between portions is limited to Poisson coupling. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low. Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

In addition, with the typical Rosen transformer, it is generally necessary to alternately apply positive and negative voltages across opposing faces of the vibrator portion 21 of the member in order to "push" and "pull", respectively, the member into the desired shape. Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. In order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Also generally known are PTs polarized and vibrating in the thickness direction (i.e., vibrations are parallel to the direction of polarization of the layers). Illustrative of such thickness mode vibration PTs is the device of U.S. Pat. No. 5,118,982 to Inoue shown in FIG. 3. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT (TMPT) of FIG. 3 comprises a low impedance vibrator portion 11 including a plurality of piezoelectric layers 211 through 214 and a high impedance vibrator portion 12 including a piezoelectric layer 222, each of the layers being integrally laminated, and caused to vibrate in thickness-extensional mode. The low impedance portion 11 has a laminated structure which comprises multi-layered piezoelectric layers 211 through 214 each being interposed between electrodes including the top surface electrode layer 201 and internal electrode layers 231 through 234. The high impedance portion 12 is constructed of the bottom electrode layer 202, an internal electrode layer 234 and a single piezoelectric layer 222 interposed between both electrode layers 202 and 234. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness. The TMPT has a common electrode 234 to which one terminal 16 of each portion is connected. The total thickness of the TMPT of FIG. 3 is restricted to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode (d33 mode). This vibration of the low impedance portion 11 excites a vibration (g33 mode) in the high impedance portion 12. As the high impedance portion 12 vibrates, the g33 mode deformation of the high impedance portion 12 generates an electrical voltage across the electrodes of the high impedance portion 12. When operating the TMPT in the thickness-extensional mode with a resonance of lambda/2 mode (both end free fundamental mode) or lambda mode (both end-free secondary mode), the TMPT may operate in a frequency range of 1–10 MHz.

Electro-luminescent (EL) lamps are known in the prior art. Liquid Crystal Displays (LCDs) must be lighted for viewing in darkness or low ambient light conditions by projecting light forward from the back of the LCD display. EL lamps are popular backlights for liquid crystal displays and keypads because EL lamps are flexible, lightweight, thin, vibration and impact resistant, and can be shaped into small, complex or irregular forms. EL lamps evenly light an area without creating "bright-spots". Since EL lamps typically consume much less current than incandescent bulbs or light emitting diodes (LEDs), their low power consumption, low heat generation and flexibility make them ideal for battery powered portable applications. Typical EL lamp backlighting applications include: keyless entry systems; audio/video equipment remote controllers; PDA keyboards and displays; timepieces and watches; LCD displays in cellular phones, pagers, and handheld Global Positioning Systems (GPS); face illumination for instrumentation; assistance lighting for buildings; and decorative lighting for sign-displays and merchandising displays. Typical EL Lamp Applications also include a variety of other devices such as: Safety illumination; Portable instrumentation; Battery-operated displays; LCD modules; Toys; Automotive displays; Night lights; Panel meters; Clocks and radios; Handheld computers and Caller ID displays.

A common characteristic of both Rosen PTs and TMPTs is that they preferably vibrate in a resonant mode predominantly along one plane or direction (i.e., radial or longitudinal planes, and thickness or longitudinal directions).

A problem with Rosen type PTs is that they have a power density limited to 5–10 Watts/cm$^3$ which limits its application to small size applications.

Another problem with Rosen type PTs is that they are polarized in two directions which is a complicated process.

Another problem with Rosen type PTs is that they typically suffer from mechanical fatigue and breakdown in the interface between sections from poling stresses.

Another problem with Rosen type PTs is that they are difficult to mount and thus have complicated mounting housings.

Another problem with Rosen type PTs is that they do not develop sufficient power to drive an electro-luminescent (EL) device.

A problem with TMPTs is that the voltage generated by the TMPT, which is optimized for low loads (100–1000 Ohms) is too low for applications such as for driving an EL device (50K–100K Ohms.)

Another problem with TMPTs is that the thickness mode resonant frequency is too high for some applications.

Another problem with TMPTs is that the addition of layers makes the PT profile (height) too high to be placed within miniaturized circuits.

Another problem with TMPTs is that the addition of layers makes the thickness dimension to close to the longitudinal or radial dimensions.

Another problem with prior PTs is that the addition of layers to the PT does not significantly raise the power density of such devices and may increase capacitive and dielectric losses.

Another problem with TMPTs is that the efficiency of the transformer is low due to several spurious resonance peaks (in the longitudinal mode) affecting the thickness mode resonance.

Another problem with TMPTs is that the frequency characteristics of the efficiency are poor when applied to a driving circuit due to power loss generated by circulating current.

Another problem with both Rosen type PTs and TMPTs is that they do not have a sufficient power transmission capacity for some applications.

Another problem with both Rosen type PTs and TMPTs is that they do not have a sufficient power density for some applications, particularly in application where size is a constraint.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power density and transmission capacities.

It would also be desirable to provide a piezoelectric transformer design that develops a higher voltage than similarly sized prior piezoelectric transformers.

It would also be desirable to provide a piezoelectric transformer that is smaller than prior piezoelectric transformers that have similar voltage output but lower power density.

It would also be desirable to provide a piezoelectric transformer that has a low profile as compared to prior piezoelectric transformers that have similar power transmission capacities and voltage outputs.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a driving circuit incorporating a piezoelectric transformer of the character described for use in EL backlit devices.

It would also be desirable to provide a piezoelectric transformer sufficiently miniaturized to be adapted to limited space applications.

It would also be desirable to provide a piezoelectric transformer capable of generating large startup voltages for EL devices.

It would also be desirable to provide a piezoelectric transformer capable of generating sufficient power to drive an EL device in steady state operation.

It would also be desirable to provide a piezoelectric transformer having high power density to allow for miniaturization.

SUMMARY OF THE INVENTION

According to the present invention, there is provided a piezoelectric transformer (PT) preferably operating at a natural (i.e. "resonant") frequency to convert a transformer input signal of a first character (i.e. voltage, frequency and current) to a transformer output signal of a second character (i.e. voltage, frequency and current). The disclosed. PT efficiently accomplishes the described signal conversion by subjecting the input "driver" section of the PT to an alternating voltage (or in certain embodiments a pulsed voltage) which causes the input portion(s) to deform and vibrate, which in turn causes the output portion(s) to vibrate, which in turn causes the "driven" output portion of the PT to deform, and which in turn generates an output voltage at the driven section of the transformer.

The preferred embodiment of the invention provides a multi-layer piezoelectric transformer PT. The PT preferably has a disc-shaped input portion which comprises one or more layers of PZT. The input layers are electroded on each major face and are poled between the electrodes perpendicular to the input layers major faces (in the thickness direction). Application of an alternating voltage causes the input layer(s) to expand and contract depending on the polarity of the voltage.

The output layer of the PT comprises one or more disc-shaped layer(s) of PZT bonded along a major face to the input portion. The output layer preferably has electrodes on its two opposing major faces. The output layer is poled between the electrodes perpendicular to the output layer's major faces (in the thickness direction). A deformation of the input portion causes a deformation of the output layer, which generates the output voltage across the output electrodes. In an alternate embodiment an insulator layer, such as alumina, may be bonded between the input portion and the output layer to provide electrical isolation between the input and output side. The output voltage may be applied to a resonant circuit for driving an electro-luminescent (EL) device.

Accordingly, it is an object the present invention to provide a PT design that has a higher power density and transmission capacity than similarly sized prior PTs.

It is another object of the present invention to provide a PT of the character described that has a smaller size and a lower profile than prior PTs that have similar power transmission capacities.

It is another object the present invention to provide a PT design that has generates a higher voltage than similarly sized prior PTs.

It is another object of the present invention to provide a PT of the character described that has a smaller size and a lower profile than prior PTs that have similar voltage output.

It is another object of the present invention to provide a PT of the character described in which the "driver" portion of the device and the "driven" portion of the device are not the same electroactive element.

It is another object of the present invention to provide a PT of the character described that develops a substantial mechanical advantage between the driver portion of the device and the driven portion of the device.

It is another object of the present invention to provide a PT of the character described that is relatively less expensive to manufacture than prior PTs that perform comparable power conversion functions.

It is another object of the present invention to provide a PT of the character described that may achieve a higher voltage gain than prior PTs.

It is another object of the present invention to provide a PT of the character described and that is simpler to manufacture than prior PTs.

It is another object of the present invention to provide a PT of the character described that has fewer losses due to capacitive and dielectric losses.

It is another object of the present invention to provide a PT that generates less heat than prior PTs, and thereby has reduced losses due to heat.

It is another object of the present invention to provide an inverter circuit incorporating a PT the character described.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 11:
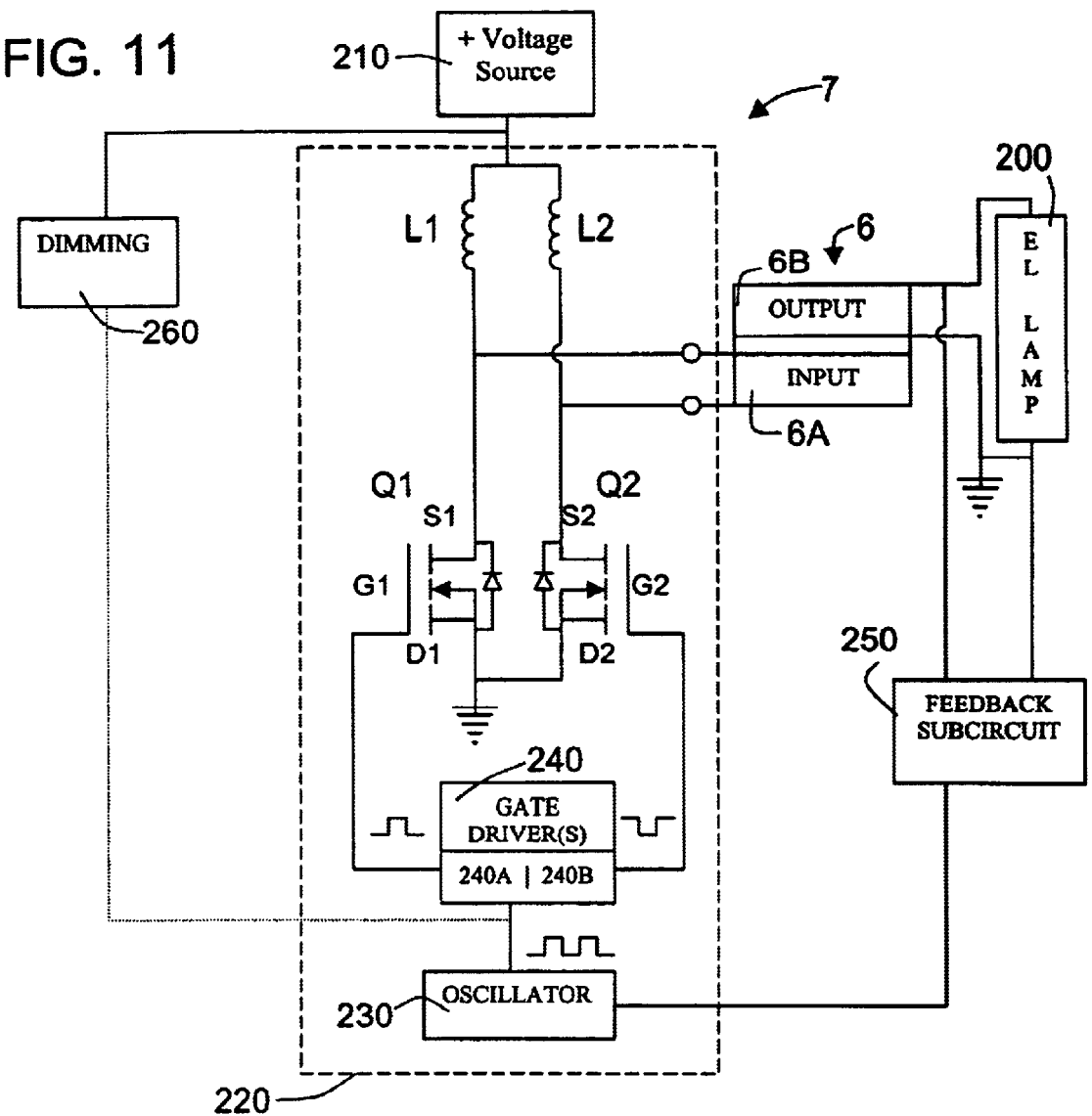
FIG. 11 is a circuit block diagram of a circuit for driving an EL device using the above PT.

As will be described more fully herein below, according to the preferred embodiment of the present invention, there is provided an electric circuit that incorporates a piezoelectric transformer 1 operating at its natural (i.e. "resonant") frequency to convert a transformer input signal of a first character (i.e. voltage, frequency and current) to a transformer output signal of a second character (i.e. voltage, frequency and current). The described circuit, which preferably is powered by a DC source, but may be powered by a rectified AC source, efficiently accomplishes the described signal conversion by subjecting the driver (or, "input") section 1A of the piezoelectric transformer 1 to a voltage of a first polarity, which in turn causes the input portion of the piezoelectric transformer 1 to deform; which in turn causes the mechanically bonded driven (or, "output") section 1B of the piezoelectric transformer to deform, and which, in turn, generates an output voltage at the driven section 1B of the transformer 1. As will be more fully described herein below, and as illustrated in FIG. 11, a resonant circuit 58 is provided for oscillating the piezoelectric transformer 1 at its resonant frequency for driving an (electro-luminescent/) EL backlit device.

It will be understood from the instant disclosure that a circuit constructed and operated in accordance with the principles of the present invention can be most advantageously practiced by using a multi-layer piezoelectric transformer that is capable of achieving high energy (power and voltage) transmission. Accordingly, a description of the construction and characteristics of the preferred high performance multi-layer piezoelectric transformer is given below. However, it should be understood that other, conventional, piezoelectric transformers may be used in modified embodiments of the invention to advantageously optimize the operational (i.e. voltage conversion and power transmission) performance of such conventional transformers.

In a preferred embodiment of the invention, which comprises a multi-layer piezoelectric transformer PT that is capable of achieving high power density capabilities, the PT may be used in a voltage converter circuit providing power-supply and control for an EL device, particularly an EL backlighting device. However, it should be understood that the PT of the present invention may be advantageously used for many applications, and the scope of the invention, therefore, should not be limited by the nature or description of the "load" that may be applied to the transformer's output.

Multi-Layer Piezoelectric Transformer

In the present invention, a multilayer piezoelectric transformer is provided that does not use the conventional longitudinal or thickness mode resonant vibrations exclusively for step-up voltage conversion applications. Typical PTs utilize a variety of constructions in attempting to provide greater voltage gain and power to circuit applications. The electromechanical interactions in a piezoelectric body are governed by Constitutive Law having their interrelations in the following equations/matrices:

$$S = s^E T + dE \qquad (1)$$

$$D = \epsilon^T E + d'T \qquad (2)$$

and, particularly for the case of PZT ceramic materials:

$$\begin{bmatrix} \varepsilon_1 \\ \varepsilon_2 \\ \varepsilon_3 \\ \gamma_{23} \\ \gamma_{31} \\ \gamma_{12} \\ \hline D_1 \\ D_2 \\ D_3 \end{bmatrix} = \begin{bmatrix} s_{11} & s_{12} & s_{13} & 0 & 0 & 0 & | & 0 & 0 & d_{31} \\ s_{12} & s_{22} & s_{13} & 0 & 0 & 0 & | & 0 & 0 & d_{31} \\ s_{13} & s_{13} & s_{33} & 0 & 0 & 0 & | & 0 & 0 & d_{33} \\ 0 & 0 & 0 & s_{44} & 0 & 0 & | & 0 & d_{15} & 0 \\ 0 & 0 & 0 & 0 & s_{44} & 0 & | & d_{15} & 0 & 0 \\ 0 & 0 & 0 & 0 & 0 & 2(s_{11}-s_{12}) & | & 0 & 0 & 0 \\ \hline 0 & 0 & 0 & 0 & d_{15} & 0 & | & \varepsilon_{11} & 0 & 0 \\ 0 & 0 & 0 & d_{15} & 0 & 0 & | & 0 & \varepsilon_{11} & 0 \\ d_{31} & d_{31} & d_{33} & 0 & 0 & 0 & | & 0 & 0 & \varepsilon_{33} \end{bmatrix} \begin{bmatrix} \sigma_1 \\ \sigma_2 \\ \sigma_3 \\ \tau_{23} \\ \tau_{31} \\ \tau_{12} \\ \hline E_1 \\ E_2 \\ E_3 \end{bmatrix} \qquad (3)$$

In the above equations S is the 6×1 matrix relating to strain and T is the 6×1 matrix relating to stress. The strain matrix S includes elements of linear strain ($\epsilon$) and shear strain ($\gamma$), and the stress matrix T includes elements of linear stress ($\sigma$) and shear stress ($\tau$). D is the 3×1 matrix relating to the electric displacement and E is the 3×1 matrix relating to the electric field. $s^E$ is the 6×6 matrix representing the zero field compliance of the material along the Cartesian and shear axes and represents purely mechanical deformation. $\epsilon^T$ is the 3×3 matrix representing the dielectric constant under condition of constant zero stress along Cartesian axes and represents purely electrical behavior of a material. Because the present invention involves piezoelectric materials, the electrical and mechanical behaviors of the material are interrelated by the piezoelectric coefficient matrices (the 6×3 matrix d and transpose 3×6 matrix d').

The electromechanical deformations possible in a piezoelectric material are the $d_{33}$ deformation parallel to the poling axis, the $d_{31}$ deformation orthogonal to the poling axis, and the $d_{15}$ deformation which is a shear deformation relative to the poling axis. Thus, for a poled block of material, the $d_{33}$ coefficient is obtained when a stress $\sigma_3$ is applied along the z (i.e., 3) direction. The charge is also collected on the face perpendicular to the z direction. To measure the $d_{31}$ coefficient, a stress or stress component $\sigma_1$ or $\sigma_2$, is applied along either the x (i.e., 1) or y (i.e., 2) direction and the polarization is collected on the face perpendicular to the z direction. This coefficient is, however, negative in sign relative to the $d_{33}$ coefficient. Similarly, to measure the $d_{15}$ component, shear stresses $\sigma_{23}$ ($\sigma_4$) or $\sigma_{13}$ ($\sigma_5$) must be applied and the polarization is thereafter measured on the face perpendicular to the x direction.

Applying the above matrix to the Rosen type transformer, one can see that that the Rosen transformer relies primarily on the $d_{31}$ deformation along its longitudinal axis. Although there is a corresponding deformation in the axes orthogonal to the longitudinal axis, the deformation along these axes is proportional to the dimensions along those axes and is a function of Poisson coupling. Because the longitudinal dimension is greater than the width and much greater than the thickness of the Rosen transformer, the deformation and resultant electric field in the thickness and width directions are merely higher order effects which do not significantly contribute to the electric field in these directions. In fact, the electric field in the $d_{33}$ and $d_{31}$ directions are of opposite polarity and therefore the electric field in the $d_{33}$ mode diminishes the electric field generated in the $d_{31}$ mode.

Furthermore, because the Rosen transformer is in a free vibrational mode, typically mounted by one or more of its nodes of vibration, the Rosen transformer is not constrained at all in its deformation. Therefore, the Rosen transformer primarily deforms along the axis along which it has a natural tendency to deform, namely the longitudinal axis and no others. The Rosen transformer does not deform along any of the shear axes, not being poled, constrained or otherwise disposed to exhibit shear strain.

Applying the above matrix to a thickness-extensional mode piezoelectric transformer (TMPT), one can see that that the TMPT relies primarily on the $d_{33}$ deformation along its thickness axis. Although there is a corresponding deformation in the axes orthogonal to the thickness axis, the deformation along these axes is proportional to the dimensions along those axes and is a function of Poisson coupling. Because the TMPT is driven at a frequency related to the thickness of the layers, which are much smaller than the width (or radius) of the TMPT, the deformation and resultant electric field in the width (radial) direction is merely a higher order effect which does not significantly contribute to the electric field in that direction. In fact, the electric field in the $d_{33}$ and $d_{31}$ directions are of opposite polarity and therefore one diminishes the electric field generated by the other.

Furthermore, because the TMPT is in a free vibrational mode, typically mounted by one or more of its nodes of vibration, the TMPT is not constrained at all in its deformation. Therefore, the TMPT deforms primarily along the axis along which it has a natural tendency to deform, namely the thickness axis and no others. The TMPT also does not deform along any of the shear axes, not being poled, constrained or otherwise disposed to exhibit shear strain.

The above example discusses electromechanical properties of a PZT material. Other piezoelectric materials including $BaTiO_3$, $PbZrO_3$, $PbTiO_3$, $PbNb_2O_6$, $(Pb,Ca)TiO_3$, $(Pb,Sm)TiO_3$, $Pb(NbO_2)_2/PbTiO_3$, $Bi_4Ti_3O_6$, $Bi_{4.5}Na_{0.5}Ti_4O_{15}$, $(1-x)Pb(Mg_{1/3}Nb_{2/3})O_3$-$xPbTiO_3$, $(1-x)Pb(Zn_{1/3}Nb_{2/3})O_3$-$xPbTiO_3$-$yBaTiO_3$, and $(1-x)Pb(Zn_{1/3}Nb_{2/3})O_3$-$xBaTiO_3$-$yPbTiO_3$, xPZN-(1-x)PMN, xPMN-1-x)PZT, PNN-PZ-PT and xPZN-(1-x)PZT will behave similarly upon the application of shear and normal stresses. The polarization will depend on the d coefficient matrix which is determined by the crystallographic structure of the material.

Previous devices have attempted to use the shear components of the matrices ($d_{15}$, $S_{44}$, $S_{55}$, $S_{66}$, $\gamma$, and $\tau$). This is because the typical piezoelectric coefficients for the shear mode are three times lager than that of the transverse mode, and larger than the longitudinal mode. For PZT 8 (hard PZT) for example, $d_{33}$=275 pC/N, $d_{31}$=−109 pC/N and $d_{15}$=450 pC/N. As can be seen by the example the $d_{15}$ component is approximately 60 percent greater than the $d_{33}$ coefficient and over three times the $d_{31}$ coefficient. Some prior devices include biaxial transducers such as in U.S. Pat. No. 5,327,041 to Culp and composite actuators such as in U.S. Pat. No. 5,796,207 to Safari et al.

The device of Culp uses a layer of electro-deformable material that has been poled in a gradient or spiral fashion to provide shear deformation that is linear along an interfacial surface. The device of Safari uses ceramic/polymer composites having a ceramic phase oriented at an angle relative to the poling direction such that shear stresses are created. A non-ceramic phase (rods) extends through the ceramic structure along one or more axes to cancel or minimize undesirable deformation, i.e., in the d31 mode.

However, efforts to use the high value of the $d_{15}$ component to enhance the performance of piezoelectric devices, and particularly piezoelectric transformers, have been largely unsuccessful. This is because utilization of the $d_{15}$ component requires application of a shear stress $\sigma_4$ or $\sigma_5$, and collection of the charge on the face perpendicular to the x or y direction.

The present invention comprises a multilayer piezoelectric transformer having a design that enables the PT to exhibit a shear strain, deforming in the $d_{15}$ mode along the shear axes. The present configuration of PT provides high power by mechanically constraining the longitudinal or radial axis of vibration thereby using a composite resonant mode using the following design.

Figure 1:
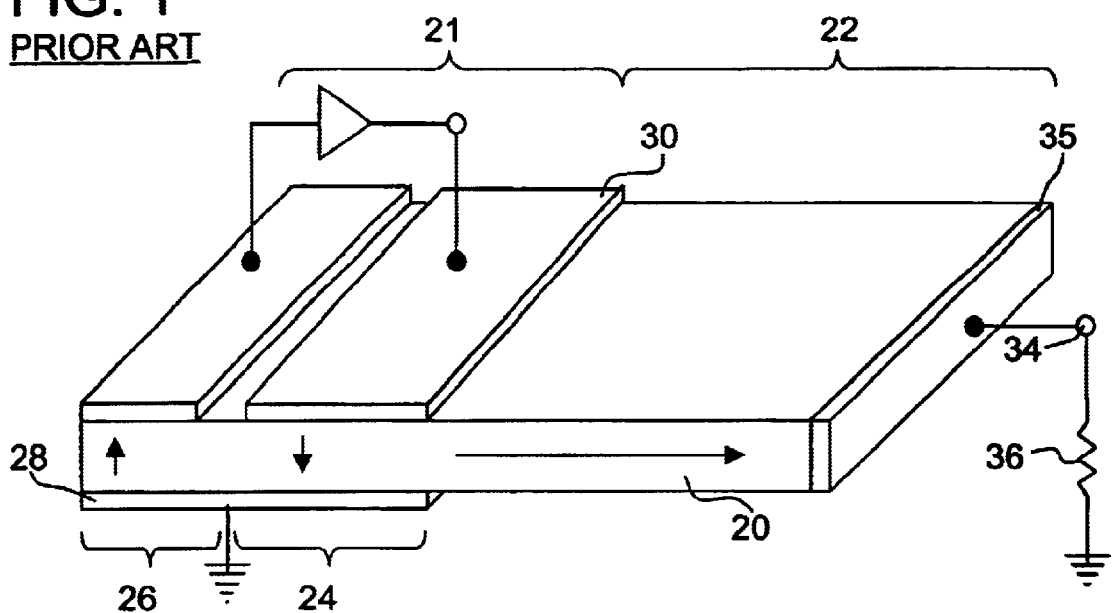
FIG. 1 is a partially schematic perspective view of a typical Rosen type piezoelectric transformer of the prior art.
Figure 2:
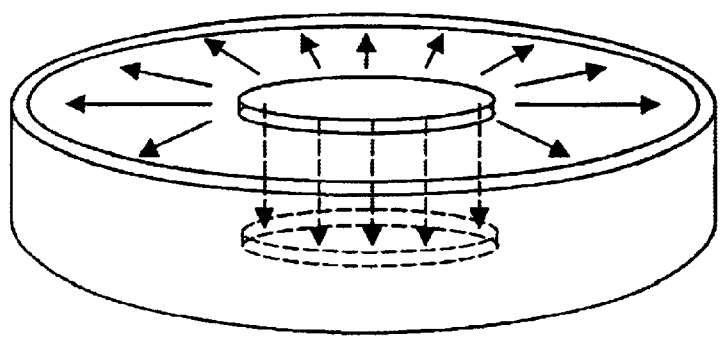
FIG. 2 is a perspective view of another example of a Rosen type piezoelectric transformer of the prior art.
Figure 3:
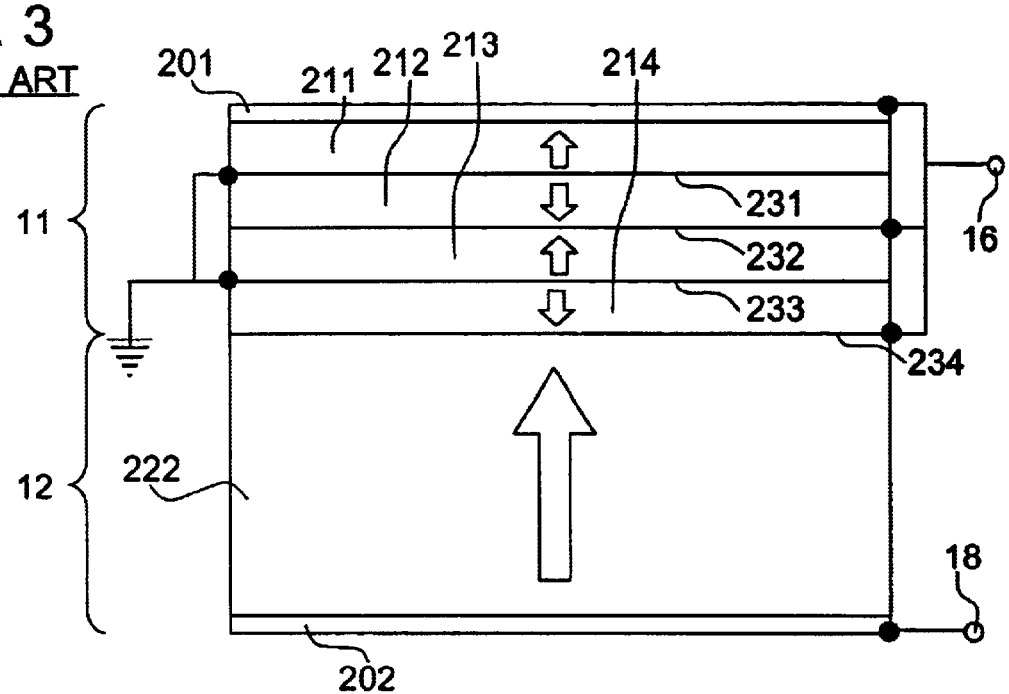
FIG. 3 is a perspective view of a typical multi-layer thickness mode vibration piezoelectric transformer of the prior art.
Figure 4:
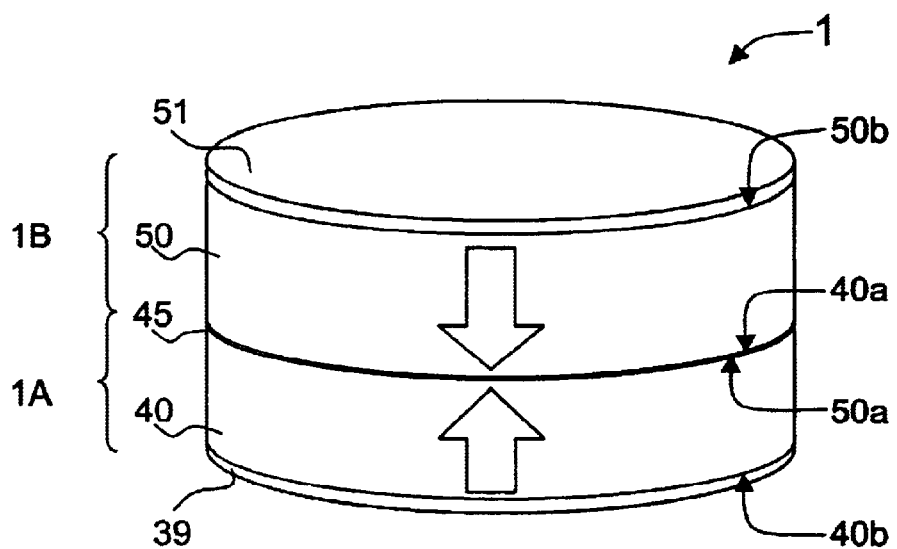
FIG. 4 is a perspective view of a 2-layer embodiment of the piezoelectric transformer of the present invention with a disc-shaped configuration.

Referring to FIG. 4: The PT 1 comprises an input portion 1A and an output portion 1B. In the simplest embodiment of the invention, the input portion 1A and the output portion 1B each comprise a single thin disk-shaped layer 40 and 50 respectively of electroactive material, preferably PZT. The input and output layers 40 and 50 are bonded along a major face 40*a* and 50*a* to a central electrode 45, preferably comprising silver, nickel or silver-palladium metallization cofired between the ceramic layers 40 and 50. Although in the preferred embodiment of the invention the central electrode 45 comprises a silver/palladium metallization, other metallization materials may be used comprising platinum, palladium, silver, gold or various other conductive metals and metal oxides and combinations thereof. The electrode 45 may also comprise a metal foil such as a copper foil bonded between the input and output layers 40 and 50 using a strong adhesive such as the imide Ciba-Geigy adhesive.

Each of the remaining major faces 40*b* and 50*b* (the outboard faces) of the input and output layers 40 and 50 also have bonded thereon an electrode layer 39 and 51 respectively preferably comprising and silver or silver-palladium metallization cofired thereon. Although in the preferred embodiment of the invention all the electrodes 39, 45 and 51 comprise a silver/palladium metallization, other metallization may be used comprising platinum, palladium, silver, gold or various other conductive metal and metal oxide metallization an combinations thereof. Some or all of the electrodes 39, 45 and 51 may also comprise a metal foil such as a copper foil bonded to the input or output layers 40 and 50 using a strong adhesive such as the imide Ciba-Geigy adhesive. As an alternative or in addition to bonding the electrodes 39 and 51 to the outboard faces of the input or output layers 40 and 50 using Ciba adhesive, the electrodes 39 and 51 be electro-deposited or vapor deposited on the major faces 40b and 50b of the input or output layers 40 and 50. Preferably, the outboard input electrode 39 is connected to an input terminal 68 and the central electrode 45 is connected to ground. Alternatively, the central electrode 45 may be connected to input terminal 68 and input electrode 39 may be connected to ground. Preferably the outboard output electrode 51 is also connected to an output terminal 67.

The input layer 40 and the output layer 50 are both poled between their respective major faces 40a and 40b, and 50a and 50b. More specifically, as shown by arrow 90, the input layer 40 is preferably poled in the thickness direction normal to its major faces 40a and 40b. Thus, when an input voltage of a first polarity is applied across input electrode 39 and the central electrode 45, the input ceramic layer 40 will tend to deform, piezoelectrically radially contracting. When a second input voltage of an opposite polarity is across input electrode 39 and the central electrode 45, the input ceramic layer 40 will tend to deform, piezoelectrically radially expanding. Thus, it will be understood that application of an alternating voltage to input terminal 68 will cause the input ceramic layer 40 to cyclically expand and contract at the frequency of the applied voltage.

Furthermore, as shown by arrow 92, the output layer 50 is preferably poled in the thickness direction normal to its major faces 50a and 50b. Thus, when a voltage of a first polarity is applied across output electrode and the central electrode, the output ceramic layer 50 will tend to deform radially piezoelectrically contracting. When a second voltage of an opposite polarity is applied across output electrode 51 and the central electrode 45, the output ceramic layer 50 will tend to deform radially piezoelectrically expanding. Thus, it will be understood that application of an alternating voltage to output terminal 67 will likewise cause the output ceramic layer 50 to cyclically expand and contract at the frequency of the applied voltage. The inverse piezoelectric effect also generates an electric field in response to a mechanical strain of the output layer 50. In other words, when the output layer 50 is subjected to a first mechanical stress, i.e., compression, the resultant strains (shear, thickness and transverse/radial) cause the output layer 50 to generate an electric field of a first polarity. Conversely, when the output layer 50 is subjected to another mechanical stress, i.e., a tensile stress, the resultant strains (shear, thickness and transverse/radial) cause the output layer 50 to generate an electric field of a second opposite polarity. Thus, it will be understood that cyclically expanding and compressing the output layer 50 will generate an oscillating electric field across the electrodes 45 and 51 of output layer 50.

Figure 5A:
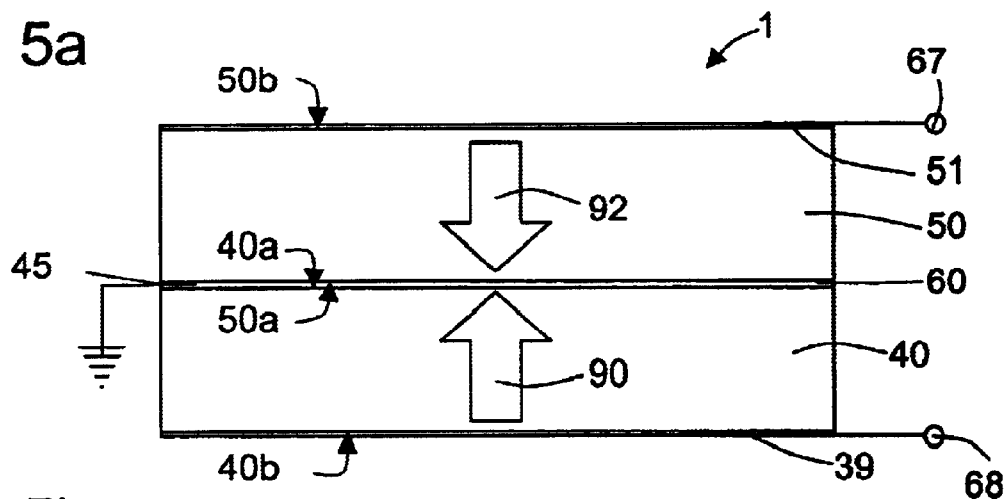
FIGS. 5A–5C are elevation views of the piezoelectric transformer of FIG. 4 showing the asymmetrical stresses in the input and output layers of the present invention.
Figure 5B:
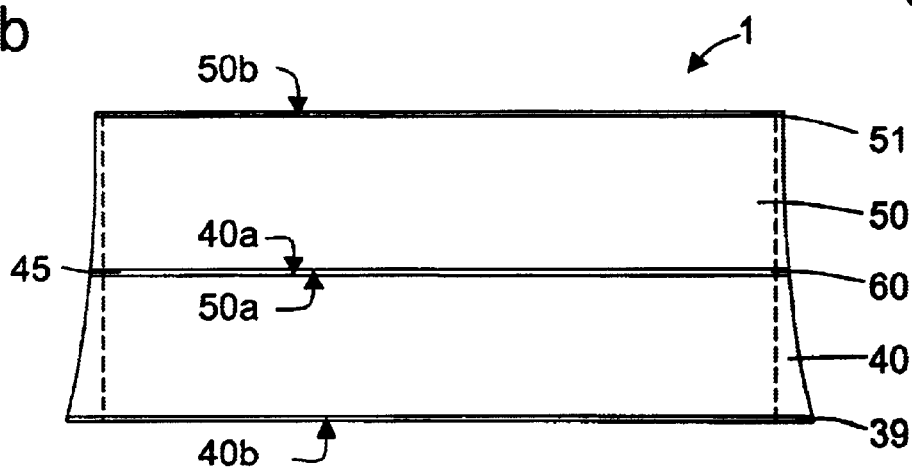
Figure 5C:
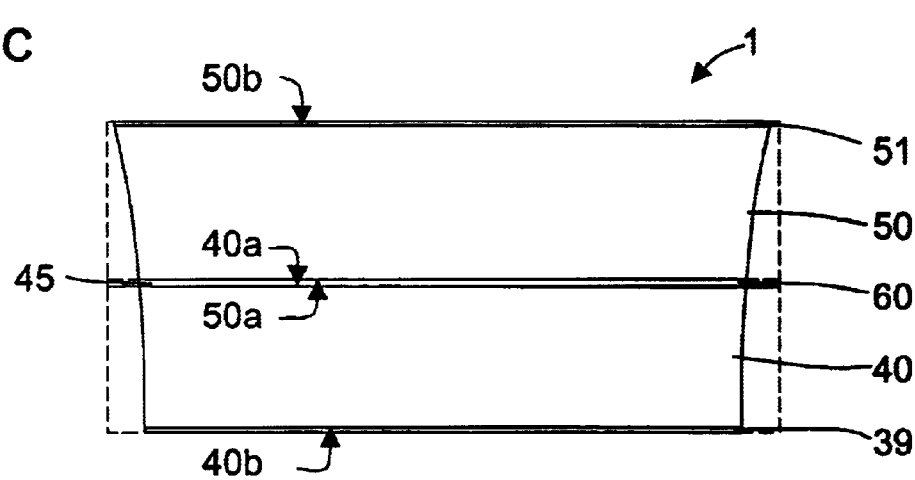

Referring again to FIGS. 5a–5c: Essential to the operation of the present PT is that the input layer 40 and output layer 50 are mechanically coupled to each other. More specifically, each of the input and output layers 40 and 50 are mechanically coupled to each other via a bondline or interfacial coupling layer 60, such as the cofired central electrode and/or adhesive and/or metallic layers. The key feature of the bondline or interfacial coupling layer 60 is that it acts as a mechanical constraint on the deformation of the bonded face 40a of the input layer 40. In other words, when an electric field is applied to the input layer 40, the bonded face 40a of the input layer 40 tends to expand or contract less than the opposing "free" face 40b of the input layer 40. The bondline or interfacial coupling layer 60 also acts as a strong mechanical coupling to the output layer 50 capable of translating mechanical motion from the bondline 60 to the bonded face 50a of the output layer 50.Thus, when the bonded face 50a of the output layer 50 deforms in response to the deformation of the bondline or interfacial layer 60, the bonded face 50a tends to expand or contract more than the opposing "free" face 50b of the output layer 50.

Figure 6:
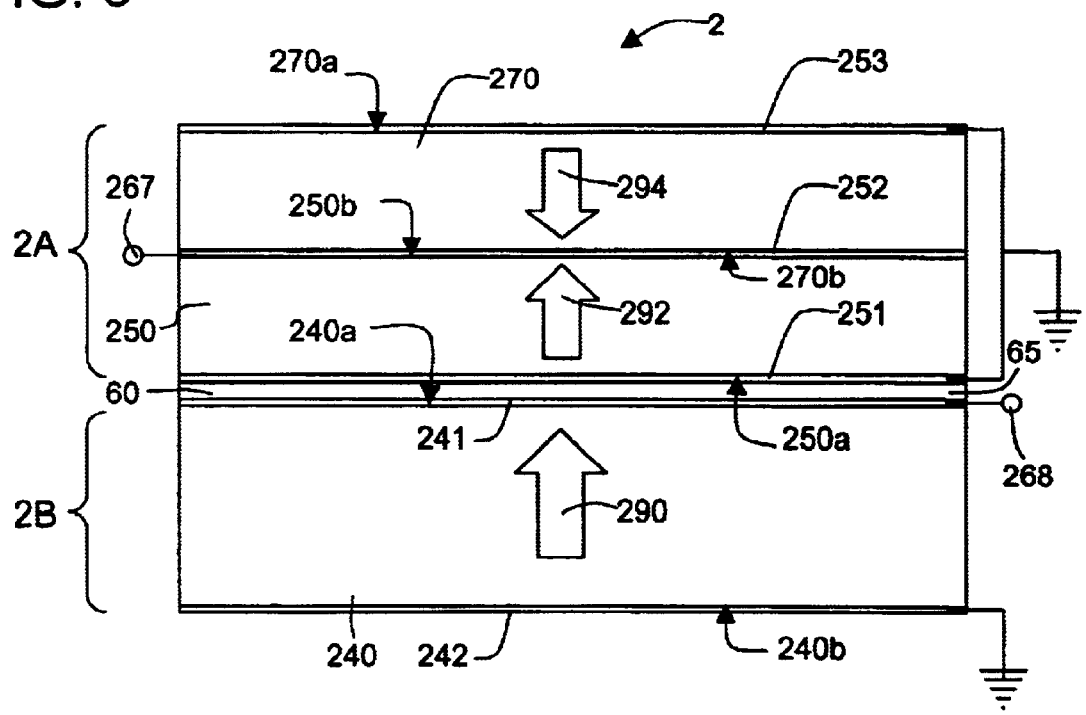
FIG. 6 is an elevation view of an alternate embodiment of the piezoelectric transformer of the present invention having an isolation layer and having multiple output layers and showing the preferred electrical connections.

Referring now to FIG. 6: In an alternate embodiment of the invention, the PT 2 has an interfacial layer 60 that comprises an insulator layer 65 bonded between the input and the output portions 2A and 2B. More specifically, the input portion 2A and the output portion 2B each comprise one or more thin disk-shaped layers of electroactive material, preferably PZT. The input portion 2A comprises an input layer 240 that has two major faces 240a and 240b on which are bonded electrodes 241 and 242. The output portion 2B comprises two output layers 250 and 270, each of which likewise has two major faces 250a and 250b, and 270a and 270b on which are bonded electrodes 251, 252 and 253. The electrodes 241, 242, 251, 252 and 253 preferably comprise silver or silver-palladium metallization cofired to the ceramic layers 240, 250 and 270. Although in the preferred embodiment of the invention the electrodes 241, 242, 251, 252 and 253 comprise a silver/palladium metallization, other metallization may be used comprising platinum, palladium, silver, nickel, gold or various other conductive metal and metal oxide metallization an combinations thereof. Some or all of the electrodes 241, 242, 251, 252 and 253 may also comprise a metal foil such as a copper foil bonded to the input and output layers 240 and 250 using a strong adhesive such as the imide Ciba-Geigy adhesive. As an alternative or in addition to bonding the electrodes 241, 242, 251, 252 and 253 to the outboard faces of the input or output layers 240 and 250 and 270 using Ciba adhesive, the electrodes 241, 242, 251, 252 and 253 may be electro-deposited or vapor deposited on the major faces 240 and 240b, 250a and 250b, and 270a and 270b of the input or output layers 240, 250 and 270.

Preferably, one input electrode 241 is connected to an input terminal 268 and the other electrode 242 is connected to ground. Alternatively, the electrode 242 may be connected to input terminal 268 and the opposite input electrode 241 may be connected to ground. Likewise for the output layers 250 and 270, one output electrode 252 is connected to an output terminal 267 and the other electrodes 251 and 253 are connected to ground. Alternatively, the electrodes 251 and 253 may be connected to output terminal 267 and the central output electrode 252 may be connected to ground.

The input layer 240 and the output layers 250 and 270 are poled between their respective major faces. More specifically, as shown by arrow 290, the input layer 240 is preferably poled in the thickness direction normal to its major faces 240a and 240b. Thus, when an input voltage of a first polarity is applied across input electrodes 241 and 242, the input ceramic layer 240 will tend to deform, piezoelectrically radially contracting. When a second input voltage of an opposite polarity is across input electrodes 241 and 242, the input ceramic layer 240 will tend to deform, piezoelectrically radially expanding. Thus, it will be understood that application of an alternating voltage to input terminal 268 will cause the input ceramic layer 240 to cyclically expand and contract at the frequency of the applied voltage.

Furthermore, as shown by arrows 292 and 294, the output layers 250 and 270 are preferably poled in the thickness direction normal to their respective major faces 250*a* and 250*b*, and 270*a* and 270*b*. Preferably the output layer 250 and 270 are poled towards the faces 250*b* and 270*b* having the central electrode 252 between them. When a voltage of a first polarity is applied across-output electrodes 251 and 252, the output ceramic layer 250 will tend to deform piezoelectrically radially contracting. Likewise, when a voltage of a first polarity is applied across output electrodes 253 and 252, the output ceramic layer 270 will tend to deform piezoelectrically radially contracting. When a second voltage of an opposite polarity is across output electrodes 251 and 252, the output ceramic layer 250 will tend to deform piezoelectrically radially expanding. Likewise, when a second voltage of an opposite polarity is across output electrodes 253 and 252, the output ceramic layer 270 will tend to deform piezoelectrically radially expanding. Thus, it will be understood that application of an alternating voltage to output terminal 267 will cause the output ceramic layers 250 and 270 to cyclically expand and contract at the frequency of the applied voltage.

The inverse piezoelectric effect also generates an electric field in response to a mechanical strain of the output layers 250 and 270. In other words, when the output layers 250 and 270 are subjected to a mechanical stress, i.e., compressed, the resultant strains (shear, thickness and transverse/radial) cause the output layers 250 and 270 to generate an electric field of a first polarity between the output electrodes 251 and 252 and output electrode 252 and 253. Conversely, when the output layers 250 and 270 are subjected to another mechanical stress, i.e., a tensile stress, the resultant strains (shear, thickness and longitudinal/radial) cause the output layers 250 and 270 to generate an electric field of a second opposite polarity between the output electrodes 251 and 252 and output electrodes 253 and 252. Thus, it will be understood that cyclically expanding and compressing the output layers 250 and 270 will generate an oscillating electric field between the output electrodes 251 and 252 and output electrodes 253 and 252.

Essential to the operation of the PT 2 is that the input layer 240 and output layer 250 are mechanically coupled to each other with an interfacial coupling layer 260. More specifically, each of the input and output layers 240 and 250 are mechanically coupled to each other via the insulator layer 65 serving as an interfacial coupling layer 260. The insulator layer 65 preferably comprises a layer of alumina cofired between the metallized faces 240*a* and 250*a* of the input and output layers 240 and 250. The insulator layer 65 may also comprise other insulator or dielectric materials including other ceramics or a layer of a strong adhesive such as Ciba adhesive. Rather than cofiring the insulator layer 65 with the input and output layers 240, 250 and 270, the insulator layer 65 may alternatively be bonded between the central faces 240*a* and 250*a* of input and output layers 240 and 250 using a strong adhesive such as Ciba adhesive. Thus, the insulator layer 65 has a bondline 71 on one major face 65*a* with the central face 240*a* of the input layer 240 and a second bondline 72 on the opposing major face 65*b* with the central face 250*a* of output layer 250. Preferably, the insulator layer 65 is slightly more rigid than the material of construction of the input layer 240, but is sufficiently compliant to deform in response to the deformation of the input layer 240 (i.e., not completely rigid). The strength of the mechanical coupling at the bondlines 71 and 72 with the insulator layer 65 is preferably sufficient to translate the deformation of the insulator 65 at least in part to the central face 250*a* of the output layer 250.

The key feature of the insulator layer 65 is that it acts as a mechanical constraint on the deformation of the bonded face 240*a* of the input layer 240. The insulator layer 65 also acts as a strong mechanical coupling to the output layers 250 and 270 capable of translating mechanical motion (deformation) from the bonded face 240*a* of the input layer 240 to the bonded face 250*a* of the output layer 250. In other words, when an electric field is applied to the input layer 240, the bonded face 240*a* of the input layer 240 tends to expand or contract less than the opposing "free" face 240*b* of the input layer 240. Conversely, when the bonded face 250*a* of the output layer 250 deforms in response to the deformation of the insulator layer 65, the bonded face 250*a* tends to expand or contract more than the opposing "free" faces 250*b* and 270*b* of the output layers 250 and 270.

In operation, application of a voltage of a first polarity to input terminal 268 across the electrodes 241 and 242 of the input layer 240 tends to cause a radial d31 mode deformation (expansion) of the ceramic layer 240. The free face 240*b* of the input layer 240 is allowed to deform (expand) to the full extent that it would under a typical d31 deformation. However, because the central bonded face 240*a* of the input layer 240 is constrained at the bondline 71 to the insulator layer 65, the central face 240*a* cannot expand to the full extent that it would were it not constrained. Likewise, application of a voltage of a second opposite polarity to input terminal 268 across the electrodes 241 and 242 of the input layer 240 tends to cause a radial d31 mode deformation (contraction) of the ceramic layer 240. The free face 240*b* of the input layer 240 is allowed to deform (contract) to the full extent that it would under a typical d31 deformation. However, because the central bonded face 240*a* of the input layer 240 is constrained at the bondline 71 to the insulator layer 65, the central face 240*a* cannot deform (contract) to the full extent that it would were it not constrained.

The expansion and contraction of the central face 240*a* of the input layer 240 causes the insulator layer 65 to expand and contract with it, depending on the relative rigidity of the material. Preferably, the insulator layer 65 is slightly more rigid than the material of construction of the input layer 240, but is sufficiently compliant to deform in response to the deformation of the input layer 240 (i.e., not completely rigid). The strength of the mechanical coupling at the bondlines 71 and 72 to the insulator layer 65 is preferably sufficient to translate the motion of the input layer 240 and insulator layer 65 at least in part to the central face 250*a* of the output layer 250 and further to output layer 270.

The expansion and contraction of the central face 240*a* of the input layer 240 causes the bonded insulator layer 65 to expand and contract with it. The bonded insulator layer 65 translates its motion at least in part to the attached central face 250*a* of the output layer 250 and further to output layer 270. More specifically, as the bonded insulator layer 65 expands in response to the expansion of the attached input layer 240, the bonded insulator layer 65 applies a tensile stress to the central face 250*a* of the output layer 250. In response to the tensile stress the output layer 250 expands. Since tensile stress is applied at the central face 250*a* of the output layer 250, and the opposing face 250*b* is bonded to the face 270a of the second output layer 270, the opposite face 250b of the output layer 250 does not deform as much as the central face 250a. In other words, one face 250b of the output layer 250 is constrained from deformation, and therefore does not strain or expand as much as the central face 250a of the output layer 250. The opposing face 250b of output layer 250 is bonded to a face 270a of the second output layer and translates its motion to that face 270a. Thus, the face 270a of the second output layer 270 has a tensile stress applied to it by the bonded face 250b of the first output layer 250. Since the tensile stress is applied only at the central face 270a of the output layer 270, and the opposing "free" face 270b does not have tensile stress applied directly to it, the stress at the "free" face 270b of the output layer 270 is only as much as is translated through the output layer 270 from the central face 270a. In other words, the free face 270b of the output layer 270 does not have as much tensile stress applied to it and therefore does not strain or expand as much as the central face 270a of the output layer 270.

Likewise, as the bonded insulator layer 65 contracts in response to the contraction of the attached input layer 240, the bonded insulator layer 65 applies a compressive stress to the central face 250a of the output layer 250. In response to the compressive stress the output layer 250 contracts. Since compressive stress is applied at the central face 250a of the output layer 250, and the opposing face 250b is bonded to the face 270a of the second output layer 270, the opposite face 250b of the output layer 250 does not deform as much as the central face 250a. In other words, one face 250b of the output layer 250 is constrained from deformation, and therefore does not strain or contract as much as the central face 250a of the output layer 250. The opposing face 250b of output layer 250 is bonded to a face 270a of the second output layer and translates its motion to that face 270a. Thus, the face 270a of the second output layer 270 has a compressive stress applied to it by the bonded face 250b of the first output layer 250. Since the compressive stress is applied only at the central face 270a of the output layer 270, and the opposing "free" face 270b does not have compressive stress applied directly to it, the stress at the "free" face 270b of the output layer 270 is only as much as is translated through the output layer 270 from the central face 270a. In other words, the free face 270b of the output layer 270 does not have as much compressive stress applied to it and therefore does not strain or contract as much as the central face 270a of the output layer 270.

Thus, when an alternating voltage is applied across the electrodes 241 and 242 of the input layer 240, the input layer, 240 deforms, which deforms the bonded insulator layer 65, which in turn deforms the output layers 250 and 270 of the PT 2. This deformation in the absence of the constraint imposed by the bonded insulator layer 65 would simply be the d31 type of radial deformation. However, because of the constraint imposed at bondline 71 by the bonded insulator layer 65, the input layer 240 exhibits a distributed gradient of stress along its thickness and as a result undergoes a shear strain and does not deform uniformly across its thickness. Additionally, due to the constraint of the second output layer 270 on first output layer 250, and the lack of any constraint on the free face 270b of the second output layer 270, the output layers 250 and 270 also undergo a shear strain and do not deform uniformly across their thicknesses. This d15 shear component of this non-uniform deformation provides for generation of greater electric fields than in the typical PT using only the d31 or d33 components.

Figure 7:
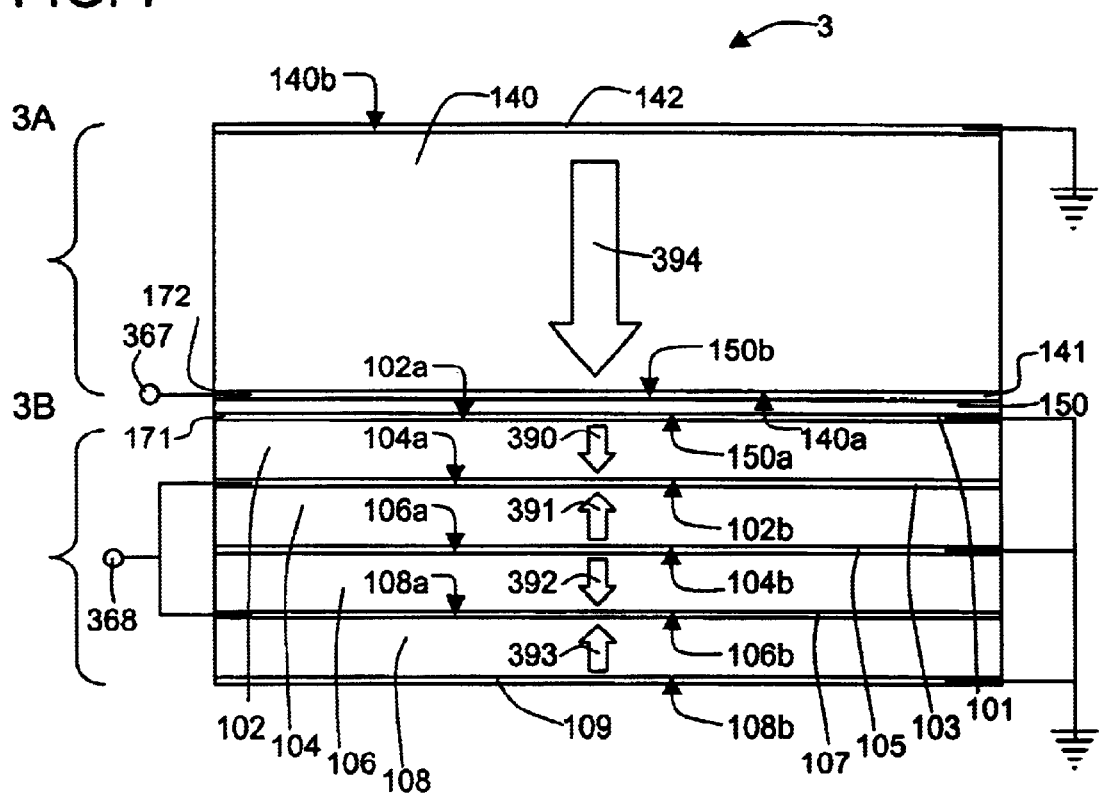
FIG. 7 is an elevation view of the preferred embodiment of the piezoelectric transformer

Referring now to FIG. 7: In yet another embodiment of the PT 3, the input portion of the PT 3 comprises multiple (N) thin input layers between multiple (N+1) electrodes. For example, in the embodiment of FIG. 7, the PT 3 input portion 3A comprises four thin disc-shaped input ceramic layers bonded between 5 electrodes, each comprising silver or silver-palladium metallization cofired with PZT input layers. Preferably, the individual input layers are thin layers that individually have greater capacitance than a single thicker layer of PZT and are therefore capable of transmitting a greater electric through them with a lower applied electric field. To facilitate the preferred performance of a single input portion having multiple layers, the input portion features the use of alternating poling of layers and alternating terminal connections. This allows the input portion 3A to behave as a single thicker layer would in response to an electrical input across the multiple electrodes and allows the electrical input to be additive in parallel across the multiple layers of the input portion 3A.

More specifically, the input portion 3A comprises four thin disc-shaped layers 102, 104, 106 and 108 of an electroactive material such as PZT. The input layers 102, 104, 106 and 108 are bonded to alternating electrode layers 101, 103, 105, 107 and 109, preferably by cofiring the stack of electroactive layers with interspersed electrodes comprising silver or silver-palladium metallization. Thus, input layer 102 is bonded between electrode layers 101 and 103 while input layer 104 is bonded between electrode layers 103 and 105. Likewise, input layer 106 is bonded between electrode layers 105 and 107 and input layer 108 is bonded between electrode layers 107 and 109. Although in the preferred embodiment of the invention the electrodes 101, 103, 105, 107 and 109 comprise a silver/palladium metallization, other metallization may be used comprising platinum, palladium, silver, nickel, gold or various other conductive metal and metal oxide metallization and combinations thereof. As an alternative to bonding the electrodes 101, 103, 105, 107 and 109 to the input layers 102 104, 106 and 108, using Ciba adhesive, the electrodes 101, 103, 105, 107 and 109 may be electro-deposited or vapor deposited on the major faces of the input layers 102 104, 106 and 108. The electrodes 101, 103, 105, 107 and 109 may also comprise a metal foil such as a copper foil bonded between the input layers 102, 104, 106 and 108 using a strong adhesive such as the imide Ciba-Geigy adhesive.

More specifically, a first input electrode 101 is bonded on a first major face 102a of the first input ceramic layer 102, and a second input electrode 103 is bonded on the remaining major face 102b of the first input ceramic layer 102. The second input ceramic layer 104 is bonded on a major face 104a to the second input electrode 103, and a third input electrode 105 is bonded on the remaining major face 104b of the second input ceramic layer 104. The third input ceramic layer 106 is bonded on a major face 106a to the third input electrode 105, and a fourth input electrode 107 is bonded on the remaining major face 106b of the third input ceramic layer 106. The fourth input ceramic layer 108 is bonded on a major face 108a to the fourth input electrode 107, and a fifth input electrode 109 is bonded on the remaining major face 108b of the fourth input ceramic layer 108. Preferably, electrodes 102 and 104 are connected to input terminal 368 and electrodes 101, 103 and 105 are connected to a common ground. Alternatively, electrodes 101, 103 and 105 may be connected to input terminal 368 and electrodes 102 and 104 may be connected to a common ground.

As mentioned above, the input layers 102, 104, 106 and 108 are preferably poled in an alternating fashion. In other words, as shown by arrows 390 and 392, input layers 102 and 106 are poled in one direction with respect to each other (normal to the major faces 102*a* and 102*b*, and 106*a* and 106*b* in the thickness direction). Also, as shown by arrows 391 and 393, input layers 104 and 108 are poled in the same direction with respect to each other (normal to the major faces 104*a* and 104*b*, and 108*a* and 108*b* in the thickness direction). but in the opposite thickness direction of layers 102 and 106. Preferably, layers 102 and 104 are poled towards the electrode 103 between them and layers 106 and 108 are poled towards the electrode 107 between them. Thus, input layers 102 and 104 are poled in opposite directions with respect to each other, but are actually poled in the same direction towards the central input electrode 103. Also, input layers 106 and 108 are poled in opposite directions with respect to each other, but are actually poled in the same direction towards a central input electrode 107. To facilitate the application of an electric field across the layers 102, 104, 106 and 108 of the input portion 3A, input terminals are connected to the input electrodes. Preferably, one input terminal 368 is connected to both electrodes 103 and 107 for simultaneous application of an electrical signal to those electrodes 103 and 107. Preferably, the remaining electrodes 101, 105 and 109 are ground connections.

Thus, each of the input layers 102, 104, 106 and 108 is poled in the thickness direction so that individually each layer 102, 104, 106 and 108 will tend to deform radially, i.e., in the d31 mode perpendicular to the respective poling directions 390, 391, 392 and 393 when a voltage is applied across a layer 102, 104, 106 and 108. However, because the layers 102, 104, 106 and 108 are bonded to each other along their major faces, each layer is constrained from deforming at the bond line.

Figure 8A:
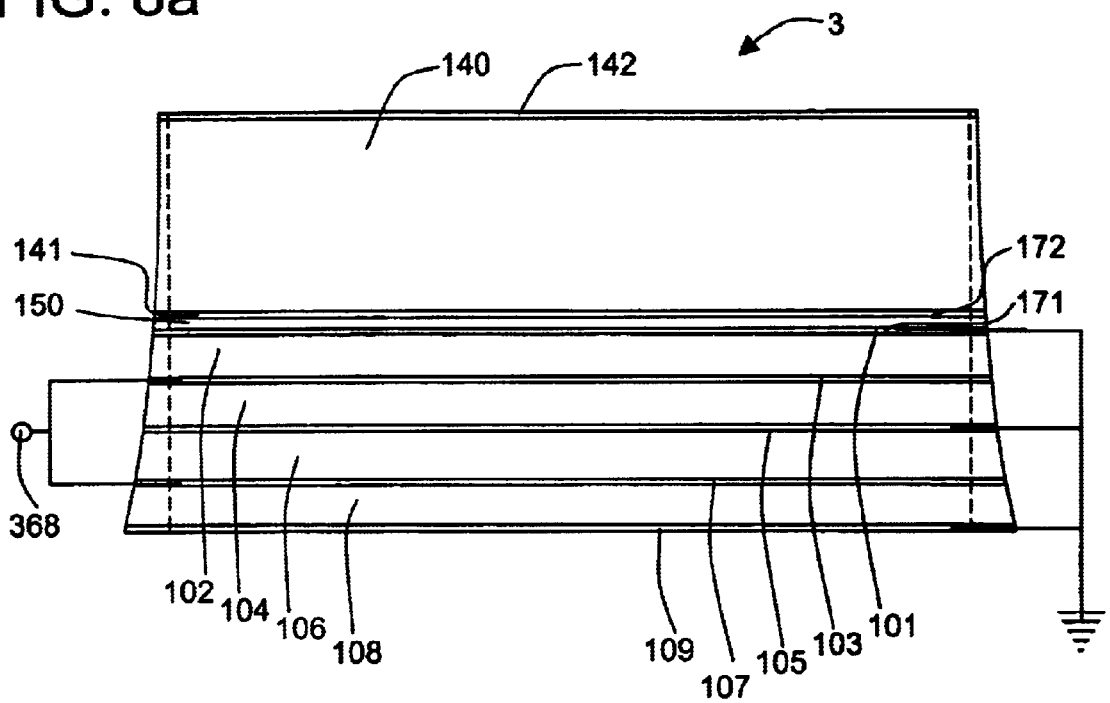
FIGS. 8A and 8B are elevation views of the piezoelectric transformer of FIG. 7 showing the asymmetrical stresses in the input and output layers.
Figure 8B:
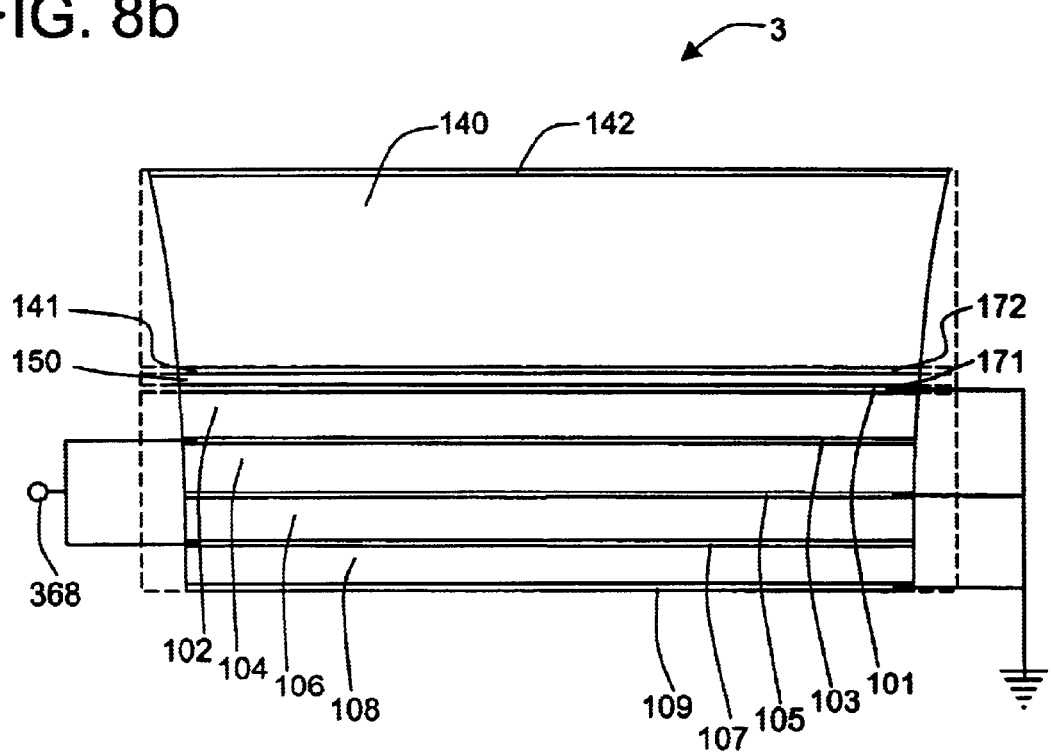

Referring to FIGS. 8*a* and 8*b*: In operation, when an electrical signal is applied to input terminal 368 attached to electrodes 103 and 107, a voltage of a first polarity (i.e., a positive polarity related to the ground electrodes 101, 105 and 109) is applied simultaneously across electrodes 103 and 101 of layer 102, electrodes 103 and 105 of layer 104, electrodes 107 and 105 of layer 106 and electrodes 107 and 109 of layer 108. Since all the layers 102, 104, 106 and 108 are poled toward the electrode to which the electrical signal is applied, they all deform in the same direction, e.g., radially expanding. Conversely, when a second electrical signal is applied to input terminal 368 attached to electrodes 103 and 107, a voltage of a second opposite polarity (i.e., a negative polarity related to the ground electrodes 101, 105 and 109) is applied simultaneously across electrodes 103 and 101 of layer 102, electrodes 103 and 105 of layer 104, electrodes 107 and 105 of layer 106 and electrodes 107 and 109 of layer 108. Since all the layers 102, 104, 106 and 108 are poled toward the electrode to which the electrical signal is applied, they all deform in the same direction, e.g., radially contracting. Thus, it will be understood that application of an oscillating voltage to input terminal 368 will cause the input portion 1A to cyclically radially expand and contract.

The input portion 3A is mechanically coupled to an output portion 3B comprising at least one output layer 140. The output layer 140 of the PT comprises another disc-shaped layer of electroactive material, preferably PZT having electrodes 141 and 142 on its two opposing major faces 140*a* and 140*b*. The electrodes 141 and 142 preferably comprise silver or silver-palladium metallization which is cofired onto the output layer 140. Alternatively, electrodes 141 and 142 may be applied by electro-deposition, vapor deposition or by bonding a conductive metal such as copper or nickel to the faces 140*a* and 140*b* of the output layer 140 using an adhesive such as Ciba or a conductive epoxy. The output electrodes 141 and 142 are connected to an output terminal 267 and ground respectively. Alternately, the terminal 367 and ground connections to electrodes 141 and 142 may be reversed. Preferably, the thickness of the output layer 140 is relatively greater than the thickness of the individual input layers 102, 104, 106 and 108 and more preferably approximately 2–4 times the thickness of the whole input portion 3A.

As shown by arrow 394, the output layer 140 is preferably poled in the thickness direction normal to its major faces 140*a* and 140*b*. Thus, when a voltage of a first polarity is applied across output electrodes 141 and 142 via terminal 367, the output ceramic layer 140 will tend to deform radially piezoelectrically contracting. When a second voltage of an opposite polarity is applied across the output electrode 141 and 142 via terminal 367 the output ceramic layer 140 will tend to deform radially piezoelectrically expanding. Thus, it will be understood that application of an alternating voltage to output terminal 367 will likewise cause the output ceramic layer 140 to cyclically expand and contract at the frequency of the applied voltage. The inverse piezoelectric effect also generates an electric field in response to a mechanical strain of the output layer 140. Therefore, when the output layer 140 is subjected to a first mechanical stress, i.e., compression, the resultant strains (shear, thickness and transverse/radial) cause the output layer 140 to generate an electric field of a first polarity between electrode 141 and 142. Conversely, when the output layer 140 is subjected to another mechanical stress, i.e., a tensile stress, the resultant strains (shear, thickness and transverse/radial) cause the output layer 140 to generate an electric field of a second opposite polarity. Thus, it will be understood that cyclically expanding and compressing the output layer 140 will generate an oscillating electric field across the electrodes 141 and 142 of output layer 140.

In the preferred embodiment of the PT 3, the central electrode 101 of the input layer 102 is bonded at bondline 171 to a first major face 150*a* of an insulator layer 150, preferably comprising a thin layer of alumina, and preferably by cofiring. On the other major face 150*b* of the insulator layer 150 is bonded the output layer 140 via electrode 141 at bondline 172, and preferably by cofiring. The constraints and deformation of the insulator layer 150 in relation to and in conjunction with the deformation of the input and output portions 3A and 3B is analogous to that described above for the insulated PT 2 of FIG. 6. In an alternate embodiment of the PT 3, the input portion 3A is bonded directly to the output portion 3B, and the constraints and deformation of the input and output portions 3A and 3B are analogous to that described above for the PT 1 of FIGS. 5A–5C.

Thus, the input portion 3A is mechanically-bonded to the output portion 3B via an interfacial coupling layer such as an insulator layer 150 or other bondline(s). Essential to the operation of the PT 3 is that the input portion 3A and output portion 3B are mechanically coupled to each other. Therefore, the central face of the central input layer 102, i.e., electrode 101 and layer 102 are mechanically coupled to the central major face of the output layer 140*a* via an interfacial coupling layer such as directly via a bondline 172 or preferably with an insulator layer 150. The bondline 172 is preferably formed by cofiring the output layer 140 simultaneously with the cofiring of the input layers 102, 104, 106 and 108. The interfacial layer and bondline 172 may alternately comprise a layer of strong adhesive such as Ciba adhesive. The insulator layer 150 preferably comprises a layer of alumina cofired between the central metallized faces of the input and output layers 102 and 140. The insulator layer 150 may also comprise other insulator or dielectric materials including other ceramics or a layer of a strong adhesive such as Ciba adhesive. Rather than cofiring the insulator layer 150 with the input and output portions 3A and 3B, the insulator layer 150 may alternatively be bonded between the central faces 102*a* and 140*a* of the input and output layers 102 and 140 using a strong adhesive such as Ciba adhesive. Thus, the insulator layer 150 has a bondline 171 on one major face 150*a* with the central face 102*a* of the input layer 102 and a second bondline 172 on the opposing major face 150*b* with the central face 140*a* of the output layer 140. Preferably, the insulator layer 150 is slightly more rigid than the material of construction of the input layers 102, 104, 106 and 108, but is sufficiently compliant to deform in response to the deformation of the input layers 102, 104, 106 and 108 (i.e., not completely rigid). The strength of the mechanical coupling at the bondlines 171 and 172 with the insulator layer 150 is preferably sufficient to translate the deformation of the insulator 150 at least in part to the central face 140*a* of the output layer 140.

The key feature of the interfacial coupling layer 150 is that it acts as a mechanical constraint on the deformation of the bonded face 102*a* of the input layer 102. Thus, when an electric field is applied to the input portion 3A, the bonded faces of the layers of the input portion tend to expand or contract less than the opposing "free" faces of the input layers 102, 104, 106 and 108. More, specifically, for example, when the voltage is applied across input layer 102, the central face 102*a* is constrained at the bondline 171 or interfacial coupling layer 150 which is not independently deforming. The opposite face 102*b* of input layer 102 is bonded to the adjacent input layer 104 which is deforming, expanding or contracting simultaneously with the first input layer 102. Therefore, the opposite faces 102*a* and 102*b* of the first input layer 102 are subjected to differing stresses, such that the central face 102*a* of the first input layer 102 is constrained from deforming more than the second face 102*b* of the input layer 102. Likewise, the second input layer 104 has opposing faces 104*a* and 104*b* that differ in the amount they strain, due to having relatively greater constraint on the face 104*a* bonded to the first input layer 102 in relation to the face 104*b* that is bonded to the third input layer 106. Furthermore, the third input layer 106 has opposing faces 106*a* and 106*b* that differ in the amount they strain, due to having relatively greater constraint on the face 106*a* bonded to the second input layer 104 in relation to the face 106*b* that is bonded to the fourth input layer 108. Finally, the fourth input layer 108 has opposing faces 108*a* and 108*b* that differ in the amount they strain, due to having constraint on the face 108*a* bonded to the third input layer 106 and no constraint on the opposite "free" face 108*b*. Thus, each of the input layers 102, 104, 106 and 108 is able to deform more on the face 102*b*, 104*b*, 106*b* and 108*b* of the layer 102, 104, 106 and 108 that is further from the interfacial coupling layer 150, the overall effect of which is similar to the deformation of an input portion comprising a single layer of the same overall thickness.

The interfacial coupling layer 150 also acts as a strong mechanical coupling to the output layer 140 capable of translating mechanical motion (deformation) from the bonded face 102*a* of the input layer 102 to the bonded face 140*a* of the output layer 140. Similar to the input portion 3A of the PT 3, when the bonded face 140*a* of the output layer 140 deforms in response to the deformation of the interfacial coupling layer 150, the bonded face 140*a* tends to expand or contract more than the opposing "free" face 140*b* of the output layer 140. Alternatively, the output portion 3B may be of a multilayer construction such that it deforms in a similar manner to that of the input portion 3A of the PT 3.

As mentioned herein above, application of a voltage of a first polarity to input terminal 168 across the electrodes 101, 103, 105, 107 and 109 of the input layers 102, 104, 106 and 108 tends to cause a radial deformation (expansion) of the ceramic layers 102, 104, 106 and 108. The free face 108*b* of the outboard input layer 108 is allowed to deform (expand) to the full extent that it would under a typical d31 deformation. However, because the central face 102*a* and internal faces 102*b*, 104*a*–*b*, 106*a*–*b* and 108*a* of the input layers 102, 104, 106 and 108 are constrained at their respective bondlines with each other, the central 102*a* and interior faces 102*b*, 104*a*–*b*, 106*a*–*b* and 108*a* cannot expand to the full extent that they would were they not constrained. Likewise, application of a voltage of a second opposite polarity to input terminal 168 across the electrodes 101, 103, 105, 107*b* and 109 of the input layers 102, 104, 106 and 108 tends to cause a radial deformation (contraction) of the ceramic layers 102, 104, 106 and 108. The free face 108*b* of the input layer 108 is allowed to deform (contract) to the full extent that it would under a typical d31 deformation. However, because the central face 102*a* and interior faces 102*b*, 104*a*–*b*, 106*a*–*b* and 108*a* of the input layers 102, 104, 106 and 108 are constrained at their respective bondlines or interfacial coupling layer, the central 102*a* and interior faces 102*b*, 104*a*–*b*, 106*a*–*b* and 108*a* cannot deform (contract) to the full extent that they would were they not constrained.

The expansion and contraction of the central face 102*a* of the input layer 102 causes the bondline/interfacial coupling layer 150 to expand and contract with it, depending on the relative rigidity of the material opposite the input layer 102 at the bondline 171, i.e., the interfacial layer 150. Preferably, the interfacial layer 150 is slightly more rigid than the material of construction of the input layers 102, 104, 106 and 108, but is sufficiently compliant to deform in response to the deformation of the input layers (i.e., not completely rigid). The strength of the mechanical coupling at the bondline/interfacial layer is preferably sufficient to translate its motion at least in part to the central face 140*a* of the output layer 140.

Referring again to FIGS. 8*a* and 8*b*: The expansion and contraction of the central face 102*a* of the input layer 102 causes the bondline 171 and interfacial coupling layer 65 to expand and contract with it. The interfacial layer 65 translates its motion at least in part to the attached central face 140*a* of the output layer 140 via the second bondline 172. More specifically, as the bondline 171 and interfacial layer 65 expand in response to the expansion of the attached input layer 102, the interfacial layer 65 applies a tensile stress to the central face 140*a* of the output layer 140 via the second bondline 172. In response to the tensile stress the output layer 140 expands. Since the tensile stress is applied only at the central face 140*a* of the output layer 140, and the opposing "free" face 140*b* does not have tensile stress applied directly to it, the stress at the "free" face 140*b* of the output layer 140 is only as much as is translated through the output layer 140 from the central face 140*a*. In other words, the free face 140*b* of the output layer 140 does not have as much tensile stress applied to it and therefore does not strain or expand as much as the central face 140*a* of the output layer 140. This expansion generates a voltage of a fist polarity between electrodes 141 and 142.

Likewise, as the bondline 171 and interfacial layer 65 contract in response to the contraction of the attached input layer 102, the interfacial layer 65 applies a compressive stress to the central face 140a of the output layer 140. In response to the compressive stress the output layer contracts 140. Since the compressive stress is applied only at the central face 140a of the output layer 140, and the opposing "free" face 140b does not have compressive stress applied directly to it, the stress at the "free" face 140b of the output layer 140 is only as much as is translated through the output layer 140 from the central face 140a. In other words, the free face 140b of the output layer 140 does not have as much compressive stress applied to it and therefore does not strain or contract as much as the central face 140a of the output layer 140.

Thus, when an alternating voltage is applied across the electrodes 101, 103, 105, 107 and 109 of the input layers 102, 104, 106 and 108, the input layers 102, 104, 106 and 108 deform, which deforms the attached interfacial layer 65 via bondline 171, which interfacial layer 65 in turn deforms the output layer 140 of the PT 3 via bondline 172. This deformation, in the absence of the constraint imposed by the interfacial layer 65 would simply be the d31 type of radial type deformation. However, because of the constraint imposed by the bondline 171 and interfacial layer 65, the input layers 102, 104, 106 and 108 undergo shear strains and do not deform uniformly across their respective thicknesses. Additionally, due to the lack of any constraint on the free face 140b of the output layer 140, the output layer(s) 140 also undergoes a shear strain and does not deform uniformly across its thickness. This d15 shear component of this non-uniform deformation provides for generation of greater electric fields than in the typical PT using only the d31 or d33 components.

Thus, upon application of a voltage of a first polarity to the input terminal, the input portion deforms (contracts), thereby contracting the bondline and attached insulator layer , which translates the deformation to the attached output layer. The deformation (contraction) of the output portion piezoelectrically generates a g15 mode output voltage of a first polarity between the output electrodes connected to output terminal 47. Conversely, upon application of a second voltage of a second opposite polarity to input terminal the input portion deforms (expands), thereby expanding the bondline or attached insulator layer, which translates the deformation to the attached output layer. The deformation (expansion) of the output layer piezoelectrically generates an output voltage of a second opposite polarity between the output electrodes connected to output terminal 47. Thus, application of an alternating voltage to the input portion causes the input layers to deform (in the d15 mode) which causes the attached bondline and/or insulator layer and output layers to deform, thereby generating an alternating output voltage (in the g15 mode).

Figure 9:
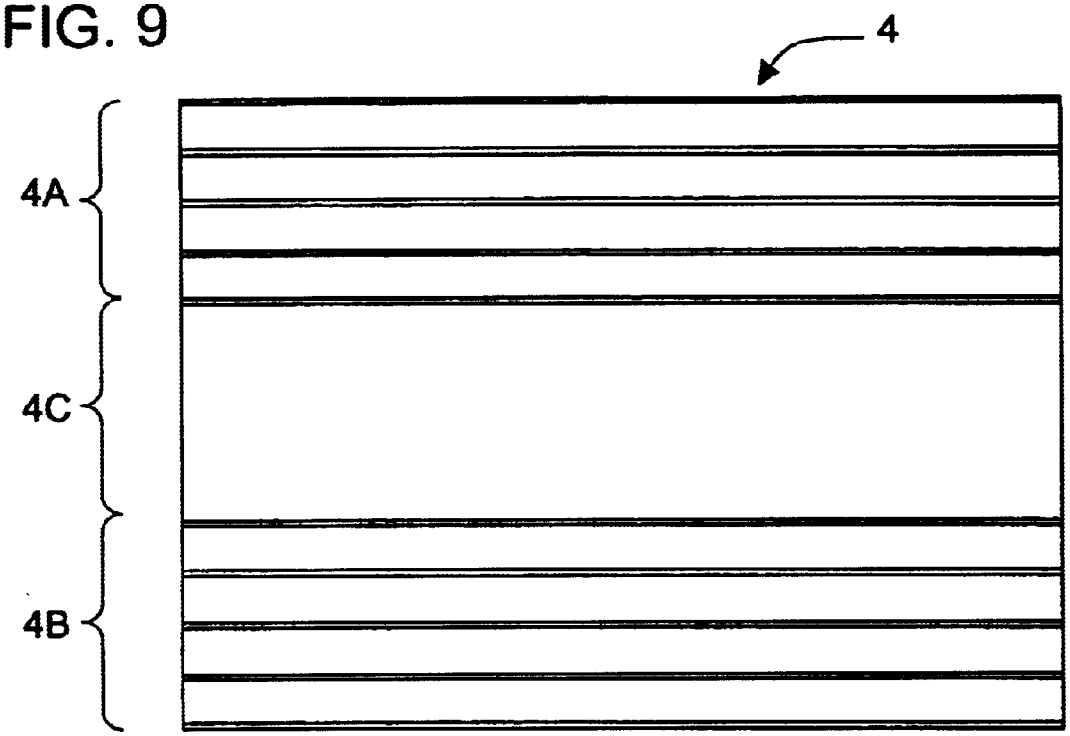
FIG. 9 is an elevation view of another embodiment of the piezoelectric transformer of the present invention having two multilayer input portions and a central output portion.
Figure 10:
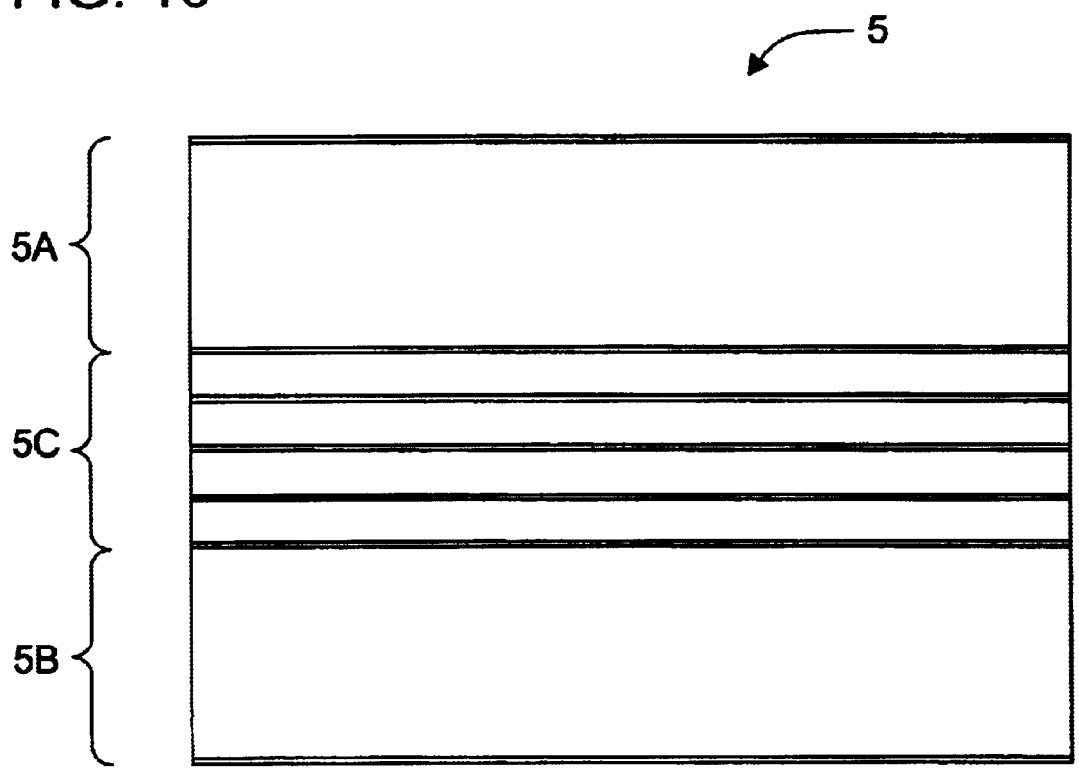
FIG. 10 is an elevation view of another embodiment of the piezoelectric transformer of the present invention having two output portions and a central multilayer input portion.

Referring to FIGS. 9 and 10: Alternate constructions of a PT according to the present invention are possible and desirable. For example, the PT may be designed with only one input layer and one output layer such as that of FIGS. 4 and 5. Alternately, a PT may be designed having an insulator layer between the input and output portions such as in FIGS. 6 and 7. Additionally, PTs may be designed having multiple input layers such as in FIG. 7 or multiple output layers as in FIG. 6. The PT 4 of FIG. 9 shows a PT having one output portion 4C bonded between two multilayer input portions 4A and 4B. In the PT 4 of FIG. 9, the function of the portions may be reversed such that one portion 4C acts as in input layer 4C bonded between two multilayer output portions 4A and 4B. The PT 5 of FIG. 10 shows an alternate PT 5 having one multilayer input portion SC bonded between two output portions 5A and 5B. In the PT 5 of FIG. 10, the function of the portions may be reversed such that one portion 5C acts as a multilayer output portion 5C bonded between two input layers 5A and 5B.

EL Driver Circuit

It will be understood that the composite radial shear mode PTs of FIGS. 4–10 described above may be used in a variety of circuits. The present invention describes a circuit 7 as in FIG. 17 incorporating the PT for use in powering an EL backlighting device. In certain embodiments of the invention it is desirable to use a PT to drive the EL device and not concern oneself with providing electrical isolation between the input and output sides of the circuit/PT as in the PTs of FIGS. 4,5, 9 and 10. A circuit 7 incorporating such a PT simply having an input portion bonded directly to an output portion may be described as a three terminal non-isolating PT circuit 7. This is because the three terminal device only has an input terminal, an output terminal and a central common terminal.

In other embodiments of the circuit, it is also desirable to provide electrical isolation between the input and output portions of the circuit by using a PT such as the PTs 2 and 3 in FIGS. 6–8, hereinafter referred to as an isolation PT 6. The circuit having a PT 6 that has an insulation layer 65 bonded between the input 6A and output portions 6B is described as a four terminal isolating PT 6 circuit 7. This is because the input portion 6A has two terminals 61 and 62 (exterior and interior respectively) and the output portion also has two terminals 63 and 64 (interior and exterior respectively) separated by the insulation layer 65. Although the two interior terminals 62 and 63 may be connected to each other, this obviates the isolation between the input portion 6A and output portion 6B, and therefore in the preferred embodiment of the invention the input and output portions 6A and 6B have separate electrical/ground connections to the interior terminals 62 and 63 respectively.

Referring now to FIG. 11: The block diagram of FIG. 11 is representative of a circuit topology for driving the present PT 6 in an EL driver circuit 7. This circuit 7 applies a voltage to the input portion 6A of the transformer 6 through a resonant switching converter 220, such as a half-bridge converter, a push-pull mode switching converter, a class-E resonant converter or other similar resonant topology. Particularly, a half bridge converter topology or class-E topology is appropriate for embodiments where there is no need for isolation between the input and output grounds of the transformer. Since in the preferred mode of operation of the transformer, it is preferred to provide isolation between the input and output, a push-pull mode resonant switching converter is preferred. The switching converter 220 of FIG. 11 comprises a pair of inductors L1 and L2 and a pair of switching devices, such as transistors Q1 and Q2 used in conjunction with an oscillator 230 and gate drive 240. The voltage source 210 is connected across the input layer 6A to ground via each inductor-transistor pair (L1-Q1 or L2-Q2) depending upon which switching device Q1 or Q2 is closed. Each switch Q1 and Q2 is driven by a gate drive 240 connected to the respective gates G1 and G2. The gate drives 240 operate in conjunction with an oscillator (timer) 230 such that when the gate G1 of the first switch Q1 is de-energized, the gate G2 of the second switch Q2 is energized and vice versa. The output portion 6B of the transformer 6 is connected to the EL lamp 200. A feedback subcircuit 250 may be provided between the transformer 6 and the oscillator 230 in order to ensure the transformer 6 operates at resonance. Dimming 260 may also be provided to control the output of the transformer 6 and consequently the relative intensity of the EL lamp 200.

Figure 12:
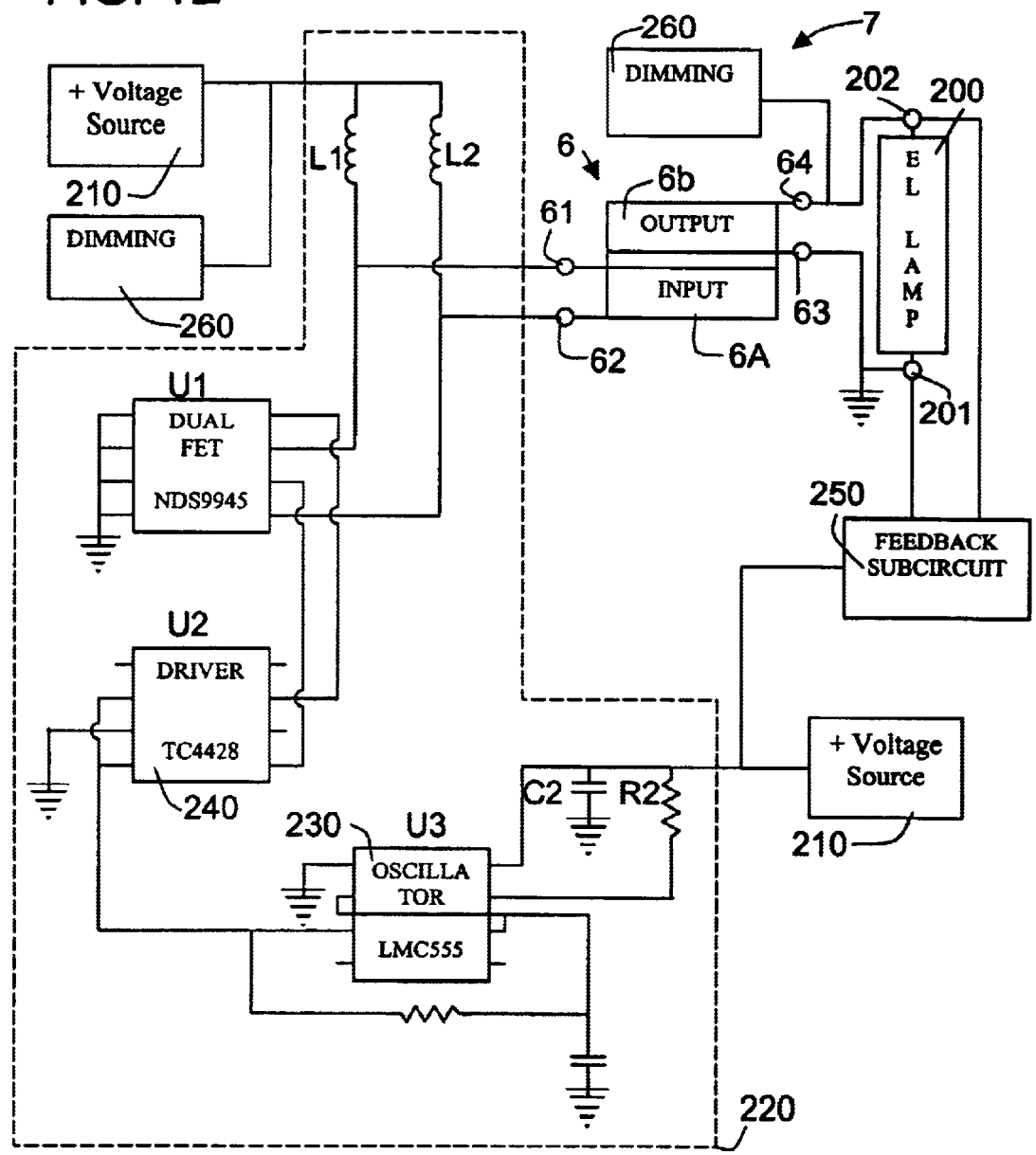
FIG. 12 is a detailed circuit schematic of an embodiment of the circuit in FIG. 11.

Referring now to FIG. 12: FIG. 12 shows one embodiment of a circuit according to the topology of FIG. 11. More specifically, a positive voltage source 210 is provided. Preferably, the voltage source 210 is a DC source such as a battery with a voltage in the range of +3 to +15 VDC. The voltage source 210 may also include a rectified AC voltage source. A voltage regulator may also be included to limit or filter the output voltage signal. The voltage source 210 is linked to the input electrode(s) connected to one input terminal 62 via an inductor L1. The first input terminal 61 is for applying voltage pulses of a first polarity to the input portion 6A of the transformer 6. The positive voltage input is also linked to the other input electrode(s) connected to a second input terminal 62 via a second inductor L2. The second input terminal 62 is for applying voltage pulses of a second polarity to the input portion 6A of the transformer 6. Thus, the polarity of the voltage applied to the transformer 6 is positive when applying a voltage to the first input terminal 61 while the second input terminal 62 is connected to ground. Due to polarization of the input layer(s) 6A, the polarity of the voltage applied to the transformer 6 is reversed, i.e., negative when applying the same voltage to the second input terminal 62 while the first input terminal 61 is connected to ground. This arrangement may be modified such that the input voltage polarities are reversed by switching the input terminals 61 and 62 to which the voltage source 210 is connected, or even by polarizing the input portion 6A in the opposite direction.

A switching device, e.g., a transistor such as a FET, IGBT or BJT, but most preferably a MOSFET is connected to each input terminal 61 and 62. More preferably, a chip U1 is used having dual N-channel power MOSFETs with internal diodes in parallel with each switching transistor, such as NDS9945 as manufactured by Fairchild Semiconductor for example. More specifically, the source S1 of a MOSFET Q1 is electrically connected to inductor L1 and input terminal 61. The drain D1 of the MOSFET Q1 is connected to ground. This places the input portion 6A of the transformer 6 in parallel with the source S1 and drain D1 of the first MOSFET Q1. Also, the source S2 of a second MOSFET Q2 is electrically connected to inductor L2 and input terminal 62. The drain D2 of the MOSFET Q2 is connected to ground as are the ground wires of the transformer 6. This places the input portion 6A of the transformer 6 in parallel with the source S2 and drain D2 of the second MOSFET Q2.

Each switching device (MOSFETs Q1 and Q2) has a gate drive 240A and 240B connected to their respective gates G1 and G2. The preferred gates drives 240A and 240B comprise a dual high speed power MOSFET gate driver chip U2. The gate drives 240A and 240B operate in conjunction with an oscillator (timer) 230 such that when the gate G1 of MOSFET Q1 is de-energized, the gate G2 of MOSFET Q2 is energized and when the gate G2 of MOSFET Q2 is de-energized, the gate G1 of MOSFET Q1 is energized. When the gate G1 of the first MOSFET Q1 is energized, current will flow from the source S1 to the drain D1. When the first MOSFET Q1 is de-energized, the magnetic field in the inductor L1 collapses and a positive voltage pulse is applied to input terminal 61, which causes the input portion 6A of the transformer 6 to deform in a first direction, i.e., radially expand. Also, when the gate G2 of the second MOSFET Q2 is energized, current will flow from the source S2 to the drain D2. When the second MOSFET Q2 is de-energized, the magnetic field in the inductor L2 collapses and a positive voltage pulse is applied to input terminal 62, which causes the input portion 6A of the transformer 6 to deform in the opposite direction, i.e., radially contract. An example of a suitable driving device for driving the gates is the Telcom TC4428 dual gate driver U2 by Microchip, which is an integrated device that can easily switch gates G1 and G2 having large capacitances with high speed.

As mentioned above, the driver(s) 240A and 240B send one signal to the gate G1 of the first switching device Q1, and the inverse signal to the gate G2 of the other switching device Q2. To develop these two signals, the driver U2 uses as a source an oscillating signal generated by a timer/oscillator 230. The oscillator 230 may be constructed in many ways, including but not limited to: (a) a CMOS inverter-based oscillator; (b) a commercial timer, such as an LMC555 or LTI555 by National Semiconductor; and (c) other similar voltage converter oscillator (VCO) topology. An example of the preferred appropriate oscillator is a 555 DC/AC timer U3. In general, the oscillator 230 has an output pin for transmitting an oscillating voltage signal which is electrically connected to the input pin of the driver U2. The oscillator 230 is preferably configured as a 50 percent duty driver. Thus, the output of the oscillator 230 is a square wave oscillating between ground and a positive voltage of 3–15 VDC. The initial frequency of the square wave (preferably approximately 500 kHz) is set according to the Z constant determined by the combination of resistor R2 and capacitor C2 connected in parallel to the input pins of the oscillator U3 designed therefor. More specifically, the trigger pin is connected to the threshold pin and the resistor R2 is connected between the trigger pin and the output pin, whereas the capacitor C2 has one end grounded and the other end connected between the resistor R2 and the threshold pin. To determine or adjust the initial oscillator 230 frequency, a potentiometer may be used in place of the resistor R2, which may then be replaced with fixed resistor R2 after the circuit 7 is adjusted to the open circuit resonant frequency of the PT 6. The oscillator 230 is powered by an external power source such as the voltage source 210 ranging, for example, from +3 to 15 volts DC.

The high voltage end 202 of the lamp 200 or EL device is connected to the high voltage output terminal 64 of the PT 6 and the low voltage end 201 of the lamp 200 connected to the low voltage terminal 63 of the output portion 6B of the transformer 6. To provide feedback to the oscillator 230, the EL lamp 200 may be connected to ground through a feedback subcircuit 250, which may comprise voltage, current or phase based feedback and combinations thereof. For, example, current sensing circuitry can be attached at the high voltage 202 end of the lamp 200. The feedback subcircuit 250 may also be connected to the low voltage 201 end of the lamp 200 for comparison of the input and output frequency phases. The feedback signal is summed with the input value (Z) at the input to the oscillator 230. This results in the inverter oscillations being synchronized to the natural resonant frequency of the PT 6, which compensates for variations due to the temperature or the load.

The above circuit 7 is preferably configured to also use a dimming device 260 such as a switching or regulating device in order to provide a variable intensity of light from the EL device 200 attached to the output side of the transformer 6. For example, a manual analog or digital input may be used with a voltage comparator. Preferably, to accomplish dimming a switching regulator, such as voltage chopper type TL1415, may be used for on/off averaging for dimming 260. The dimming device, 260 may be attached to the circuit 7 at a variety of locations, For example, the dimmer 260 may control the voltage at the output of the transformer 6, or at the switching regulator 220, such as at the input to the inductors L1 and L2 or at the input to the gate driver 240.

Each transistor gate G1 and G2 is connected to the driver 240 that alternately energizes each gate G1 or G2. When a positive voltage signal from the driver 240 is applied to the gate G1 of the first switching device Q1, the gate G1 turns on and the switching device Q1 conducts from the source to the drain. This allows current to conduct through inductor L2 to ground across the input layer 6A and through the switch Q1. Conversely, when a positive voltage signal from the driver 240 is applied to the gate G2 of the first switching device Q2, the gate G2 turns on and the switching device Q2 conducts from the source to the drain. This allows current to conduct through inductor L1 to ground across the input layer 6A and through the switch Q2.

Thus, depending on which switch Q1 or Q2 is energized, the circuit 7 is connected across the input portion 6A through L1 and Q2 or through L2 and Q1. Due to the inductance of inductors L1 and L2, and capacitance of the input portion 6A of the PT 6 (as well as the drain to source capacitances of the switching devices Q1 and Q2), the circuit 7 behaves as a resonant circuit 7. Consequently the square wave DC voltage input becomes a sinusoidal input to the PT 6. The PT 6 has step-up ratio and power capabilities determined by its shape, size and number of input and output layers, and its piezoelectric characteristics. In order to achieve the best step-up and power capabilities, it is desirable to idealize this sinusoidal input signal. This may be achieved through Zero Voltage Switching (ZVS) described below.

In operation, the PT 6 is driven by a switched DC voltage resulting from the on/off operation of the switching transistors Q1 and Q2. Due to the high frequency associated with the converters, Zero Voltage Switching (ZVS) operation is particularly preferable. The switching transistors Q1 and Q2 are alternately turned on and off with a short dead time. During the short dead time, magnetizing current charges and discharges the drain to source capacitance of the switches Q1 and Q2, as well as the input capacitance of the PT 6. As a result, ZVS of these switches Q1 and Q2 is achieved. The inductance of each of the inductors L1 and L2 is selected to achieve ZVS by ensuring the resonance between the inductors L1 and L2 and the capacitance of the input portion 6A of the PT 6 as well as the drain to source capacitance of the switches Q1 and Q2.

Thus, by having the oscillator and gate drive alternatingly driving the gates G1 and G2 of FETs Q1 and Q2 such that one gate G1 or G2 is on while the other is off, a series of positive voltage pulses may be alternatingly applied to the input terminals T1 and T2 of the transformer to alternate the polarity of the voltage across the input portion 6A and drive the transformer 6 in a push-pull mode. When driving the transformer 6, it is preferable to drive the PT 6 at its natural resonant frequency. This is because greater deformation of the layers occurs while operating at resonance and therefore, greater voltage gains are realized. Thus, it is preferred to apply the voltage inputs at a frequency corresponding to the natural radial resonant frequency of the PT 6 which is in the range of 490–510 kilohertz.

As the input portion 6A of the PT 6 expands and contracts, the output portion 6B likewise expands and contracts generating an alternating voltage which is applied to the high voltage connection 202 of the EL lamp 200. A feedback signal is developed in the feedback subcircuit 250 which is input into the oscillator 230. This ensures that the timing of the signal from the oscillator 230 input into the driver 240 substantially corresponds to the actual resonant frequency of the PT 6, thereby maximizing the efficiency of the circuit 7. This circuit 7 provides a one hundred per cent duty cycle for driving the push-pull input portion 6A of the transformer 6.

Furthermore, the drive circuit 7 has to support only half the current resulting in lower losses, greater efficiency and lower cost components.

While the above description contains many specificities, these should not be construed as limitations on the scope of the invention, but rather as exemplification of preferred embodiments thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

The input portion may comprise as few as one ceramic layer or may be of a multi-layer construction;

The output portion may comprise as few as one ceramic layer or may be of a multi-layer construction;

The direction of polarization of the input layers in a multilayer input portion can vary and need not be toward the central electrode, but may be away from the central electrode or combinations thereof;

The direction of polarization of the layers in the multi-layer output portion need not be toward the central electrode, but may be away the central electrode;

The central electrode of the multilayer output portion need not be the high voltage electrode—the outer electrodes may carry the high voltage and the central electrode may be ground referenced;

The input and output portions may share a common ground electrode, or may have separate ground connections taking advantage of the isolation layer;

The insulating layer need not be constructed of alumina, but may be constructed of other insulating materials, including but not limited to unpoled electroactive materials that remain piezoelectrically inactive;

Accordingly, the scope of the invention should be determined not by the embodiment illustrated, but by the appended claims and their legal equivalents.

We claim:

1. A circuit for lighting an electro-luminescent device, comprising:
    a voltage source;
    an electro-luminescent device having a high voltage connection and a grounded low voltage connection;
    a switching converter comprising;
        a first inductor having first and second ends, said first end of said first inductor being connected to said voltage source;
        a second inductor having first and second ends, said first end of said second inductor being connected to said voltage source and to said first end of said first inductor;
        a first switching device having a first end and a grounded second end, said first end of said first switching device being connected to said second end of said first inductor at a first junction;
        a second switching device having a first end and a grounded second end, said first end of said second switching device being connected to said second end of said second inductor at a second junction;
        an oscillating switch driver electrically connected to said first and second switching devices such that said first switching device is closed when said second switching device is open, and such that said first switching device is open when said second switching device is closed; and a transformer device comprising;
- a first input electroactive disk having first and second opposing electroded major faces and polarized in a thickness direction normal to said first and second opposing electroded major faces such that upon application of voltage across said first and second opposing electroded major faces, said first and second opposing electroded major faces deform radially;
   - said first electroded major face being electrically connected to said first junction;
   - said second electroded major face being electrically connected to said second junction;
- a first output electroactive disk having first and second opposing electroded major faces and polarized in a thickness direction normal to said first and second opposing electroded major faces such that upon application of voltage across said first and second opposing electroded major faces, said first and second opposing electroded major faces deform radially;
   - said first electroded major face being electrically connected to said high voltage connection of said electro-luminescent device;
- a constraint layer mechanically bonded between said first electroded major face of said first input electroactive disk and said first electroded major face of said first output electroactive disk such that said constraint layer at least partially constrains said radial deformation of said first electroded major face of said first input electroactive disk;
   - wherein said constraint of said radial deformation of said first electroded major face of said first input electroactive disk prevents said first electroded major face of said first input electroactive disk from radially deforming as much as said second electroded major face of said first input electroactive disk radially deforms such that there exists a difference between the amounts of radial deformation of said first and second opposing electroded major faces of said first input electroactive disk.

2. The circuit of claim 1,
wherein said radial deformation of said first electroded major face of said first input electroactive disk radially strains said constraint layer;
and wherein said radial strain of said constraint layer is translated through said constraint layer to radially strain said first electroded major face of said first output electroactive disk;
and wherein said radial strain of said first electroded major face of said first output electroactive disk piezoelectrically generates an output voltage between said first electroded major face and said second electroded major face of said first output electroactive disk.

3. The circuit of claim 2,
wherein said difference between the amounts of radial deformation of said first and second opposing electroded major faces of said first input electroactive disk creates a shear strain in said first input electroactive disk.

4. The circuit of claim 3,
wherein said radial deformation of said first electroded major face of said first output electroactive disk is greater than said radial deformation of said second electroded major face of said first output electroactive disk such that there exists a difference between the amounts of radial deformation of said first and second opposing electroded major faces of said first output electroactive disk.

5. The circuit of claim 4,
wherein said difference between the amounts of radial deformation of said first and second opposing electroded major faces of said first output electroactive disk creates a shear strain in said first output electroactive disk.

6. The circuit of claim 5,
wherein said mechanical bond of said constraint layer is selected from the group of bonds formed through processes comprising cofiring together said constraint layer and said input and output electroactive disks, adhering together said constraint layer and said input and output electroactive disks, and combinations thereof.

7. The circuit of claim 6, wherein said transformer device further comprises:
- a second input electroactive disk having first and second opposing electroded major faces and polarized in a thickness direction normal to said first and second opposing electroded major faces such that upon application of voltage across said first and second opposing electroded major faces, said first and second opposing electroded major faces deform radially; and
- a first mechanical bond attaching said first electroded major face of said second input electroactive disk to said second electroded major face of said first input electroactive disk such that said second electroded major face of said first input electroactive disk at least partially constrains said radial deformation of said first electroded major face of said second input electroactive disk;
- wherein said constraint on said radial deformation by said second electroded major face of said first input electroactive disk prevents said first electroded major face of said second input electroactive disk from radially deforming as much as said second electroded major face of said second input electroactive disk radially deforms such that there exists a difference between the amounts of radial deformation of said first and second opposing electroded major faces of said second input electroactive disk.

8. The circuit of claim 7, wherein said transformer device further comprises:
- a second output electroactive disk having first and second opposing electroded major faces and polarized in a thickness direction normal to said first and second opposing electroded major faces such that upon application of voltage across said first and second opposing electroded major faces, said first and second opposing electroded major faces deform radially; and
- a second mechanical bond attaching said first electroded major face of said second output electroactive disk to said second electroded major face of said first output electroactive disk such that said first electroded major face of said second output electroactive disk at least partially constrains said radial deformation of said second electroded major face of said first output electroactive disk;
- wherein said difference between the amounts of radial deformation of said first and second opposing electroded major faces of said first output electroactive disk creates a shear strain in said first output electroactive disk;

and wherein said radial deformation of said second electroded major face of said first output electroactive disk radially strains said first electroded major face of said second output electroactive disk via said third mechanical bond;

and wherein said radial deformation of said first electroded major face of said second output electroactive disk is greater than a radial deformation of said second electroded major face of said second output electroactive disk such that there exists a difference between the amounts of radial deformation of said first and second opposing electroded major faces of said second output electroactive disk;

and wherein said difference between the amounts of radial deformation of said first and second opposing electroded major faces of said second output electroactive disk creates a shear strain in said second output electroactive disk.

9. The circuit of claim 8,
wherein said direction of polarization of said first input electroactive disk is opposite said direction of polarization of said second input electroactive disk.

10. The circuit of claim 9,
wherein said direction of polarization of said first output electroactive disk is opposite said direction of polarization of said second output electroactive disk.

11. The circuit of claim 10,
wherein said first and second switching devices comprise first and second transistors.

12. The circuit of claim 11,
wherein said oscillating driving device comprises a dual output gate driver having an input pin, an inverting output pin and a non-inverting output pin;
said inverting output pin being connected to a gate of said first transistor;
said non-inverting output pin being connected to a gate of said second transistor; and
an oscillator having an output pin for transmitting an oscillating voltage signal, said output pin of said oscillator being electrically connected to said input pin of said oscillating driving device.

13. The circuit of claim 12,
wherein said oscillator comprises a trigger pin and a threshold pin, a resistor and a capacitor;
said trigger pin being electrically connected to said threshold pin;
said resistor being connected between said trigger pin and said output pin;
said capacitor having a grounded first end and a second end connected between said resistor and said threshold pin.

14. The circuit of claim 13, further comprising:
a feedback subcircuit having an input side and an output side;
said input side of said feedback subcircuit being electrically connected to said high voltage connection and said low voltage connection of said electroluminescent device said output side of said feedback subcircuit being connected to said threshold pin of said oscillator.

15. The circuit of claim 14, further comprising:
a dimmer electrically connected between said first electroded major face of said first output electroactive disk and said high voltage connection of said electroluminescent device.

16. The circuit of claim 14, further comprising;
a dimmer electrically connected between said voltage source and said first and second inductors.

17. The circuit of claim 16,
wherein said feedback subcircuit comprises a subcircuit selected from the group consisting of voltage sensing, current sensing, phase sensing and combinations thereof.

* * * * *